United States Patent
Yuzurihara et al.

(10) Patent No.: US 10,992,217 B2
(45) Date of Patent: Apr. 27, 2021

(54) INSULATED POWER SOURCE AND POWER CONVERSION DEVICE

(71) Applicant: KYOSAN ELECTRIC MFG. CO., LTD., Yokohama (JP)

(72) Inventors: Itsuo Yuzurihara, Yokohama (JP); Ryosuke Ohma, Yokohama (JP); Hiroshi Kunitama, Yokohama (JP); Yu Hosoyamada, Yokohama (JP)

(73) Assignee: KYOSAN ELECTRIC MFG. CO., LTD., Yokohama (JP)

( * ) Notice: Subject to any disclaimer, the term of this patent is extended or adjusted under 35 U.S.C. 154(b) by 0 days.

(21) Appl. No.: 16/475,180

(22) PCT Filed: Feb. 23, 2017

(86) PCT No.: PCT/JP2017/006754
§ 371 (c)(1),
(2) Date: Jul. 1, 2019

(87) PCT Pub. No.: WO2018/142631
PCT Pub. Date: Aug. 9, 2018

(65) Prior Publication Data
US 2019/0341847 A1   Nov. 7, 2019

(30) Foreign Application Priority Data

Feb. 6, 2017   (JP) ............................. JP2017-019865

(51) Int. Cl.
*H02M 1/092*   (2006.01)
*H02M 1/08*   (2006.01)
(Continued)

(52) U.S. Cl.
CPC ............. *H02M 1/092* (2013.01); *H02M 1/08* (2013.01); *H02M 1/088* (2013.01); *H02M 1/096* (2013.01); *H02M 3/155* (2013.01); *H02M 7/5387* (2013.01)

(58) Field of Classification Search
CPC .... H03K 17/161; H03K 17/16; H03K 17/165; H03K 17/60; H03K 17/102; H02M 1/092; H02M 1/088
See application file for complete search history.

(56) References Cited

U.S. PATENT DOCUMENTS

2006/0043920 A1 * 3/2006 Baker .................. H02M 1/126
                                                      318/611
2010/0109622 A1   5/2010 Miki et al.
(Continued)

FOREIGN PATENT DOCUMENTS

CN          102684461 A    9/2012
DE   10 2008 055 157 A1    6/2010
(Continued)

OTHER PUBLICATIONS

Written Opinion of the International Searching Authority (Form PCT/ISA/237) dated May 9, 2017, issued in counterpart International Application No. PCT/JP2017/006754, with English Translation. (11 pages).
(Continued)

*Primary Examiner* — Rafael O De Leon Domenech
(74) *Attorney, Agent, or Firm* — Westerman, Hattori, Daniels & Adrian, LLP

(57) ABSTRACT

To suppress a leakage current flowing through a parasitic capacitor of an insulated transformer of a high-side insulated power. The present invention suppresses a common mode current using a common mode reactor by focusing on the fact that a leakage current flowing through a parasitic capacitor of an insulated transformer of a high-side insulated
(Continued)

power source resulting from a high-frequency signal generated due to an on/off operation of a high-side switching element is the common mode current. The common mode reactor reduces the common mode current and bears the high-frequency signal to prevent the high-frequency signal from being applied to the insulated transformer of the high-side insulated power source, suppress the leakage current flowing through the parasitic capacitor of the insulated transformer, and reduce an erroneous operation of the high-side switching element generated due to the leakage current flowing through the parasitic capacitor of the insulated transformer.

13 Claims, 14 Drawing Sheets

(51) Int. Cl.
    *H02M 3/155*     (2006.01)
    *H02M 7/5387*     (2007.01)
    *H02M 1/096*     (2006.01)
    *H02M 1/088*     (2006.01)

(56) References Cited

U.S. PATENT DOCUMENTS

| | | |
|---|---|---|
| 2010/0164601 A1 | 7/2010 | Jansen |
| 2010/0179023 A1 | 7/2010 | Loudot et al. |
| 2012/0235663 A1* | 9/2012 | Bayerer ............... H02M 1/088 323/311 |
| 2017/0070220 A1* | 3/2017 | Yoshida ............... H02M 7/5387 |
| 2017/0353096 A1 | 12/2017 | Kawaguchi |

FOREIGN PATENT DOCUMENTS

| | | |
|---|---|---|
| FR | 2 915 031 A1 | 10/2008 |
| JP | 8-33315 A | 2/1996 |
| JP | 2006-187138 A | 7/2006 |
| JP | 2010-119177 A | 5/2010 |
| JP | 2010-525772 A | 7/2010 |
| JP | 2010-284027 A | 12/2010 |
| JP | 5390507 B2 | 1/2014 |
| WO | 2008/142339 A2 | 11/2008 |
| WO | 2016/088211 A1 | 6/2016 |

OTHER PUBLICATIONS

International Search Report dated May 9, 2017, issued in counterpart International Application No. PCT/JP2017/006754, with English Translation. (5 pages).
Extended (Supplementary) European Search Report dated Jun. 16, 2020, issued in counterpart EP Application No. 17894958.2. (8 pages).
Office Action dated Apr. 21, 2020, issued in counterpart JP application No. 2017-019865, with English translation. (13 pages).
Office Action dated Mar. 26, 2020, issued in counterpart TW application No. 106110349, with English translation. (12 pages).
Office Action dated Jun. 17, 2020, issued in counterpart KR Application No. 10-2019-7017436, with English translation (13 pages).
Office Action dated Jun. 30, 2020, issued in counterpart JP Application No. 2017-019865, with English translation (8 pages).
Office Action dated May 22, 2020, issued in counterpart IN Application No. 201917027516, with English translation (7 pages).
Office Action dated Sep. 14, 2020, issued in counterpart TW Application No. 106110349, with English Translation. (9 pages).
Office Action dated Oct. 20, 2020, issued in counterpart JP Application No. 2017-019865, with English Translation. (6 pages).
Office Action dated Oct. 10, 2020, issued in counterpart CN Application No. 201780085653.6, with English translation (13 pages).

* cited by examiner

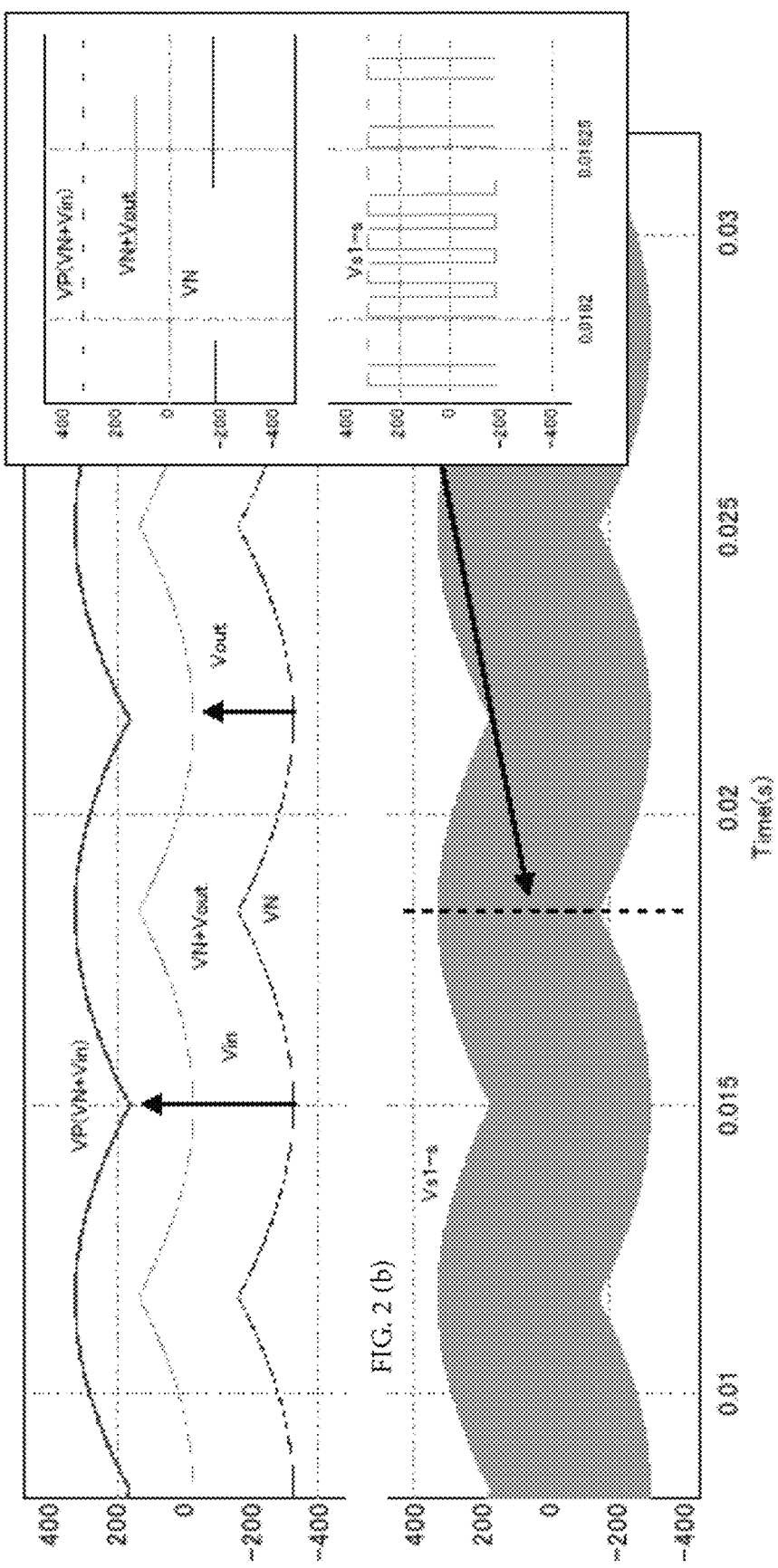

HIGH SIDE

LOW SIDE

INSULATED POWER SOURCE AND POWER CONVERSION DEVICE

BACKGROUND OF THE INVENTION

1. Field of the Invention

The present invention relates to an insulated power source and a power conversion device such as a DCDC converter and a DCAC inverter having the insulated power source.

2. Description of the Related Art

In a power conversion device such as a step-down chopper-type DCDC converter, a step-up chopper-type DCDC converter, or a DCAC inverter which uses a chopper circuit, a DC voltage from a DC power source which is a main power source is converted to a DC voltage or an AC voltage by an on/off switching operation of a switching element. The on/off operation of the switching element is performed by a driving circuit.

In a power conversion device which uses a chopper circuit, a high-voltage-side (high-side) switching element and a low-voltage-side (low-side) switching element are driven by driving circuits having different reference voltages, provided in the respective switching elements to perform power conversion. Moreover, the driving circuits have power sources that apply voltages thereto. In a switching operation of each switching element, a gate driver which is a high-side driving circuit needs to apply a voltage higher than a source voltage of a high-side switching element to the gate and needs to prevent short-circuiting between the high-side driving circuit and the low-side driving circuit having different reference voltages. Due to this, an insulated power source (a floating power source) is provided in a power source that applies a voltage to the high-side driving circuit in order to electrically insulate the high side and the low side.

Japanese Patent Application Publication No. 2006-187138 (see paragraph [0004] and FIG. 5) discloses a configuration in which a power drive transformer is used as a high-side insulated power source.

PRIOR ART

Patent Document

Patent document: Japanese Patent Application Publication No. 2006-187138 (see paragraph [0004] and FIG. 5)

SUMMARY OF THE INVENTION

Problems to be Solved by the Invention

FIG. 13 illustrates a DCDC converter 110 which uses a step-down chopper circuit as an example of a power conversion device and illustrates a configuration example in which an insulated transformer T-H is used as a high-side insulated power source 120H that drives a high-side switching element S1.

The DCDC converter 110 includes a step-down chopper circuit formed by connecting an inductance L and a series-parallel connection circuit of a high-side switching element S1 and a low-side switching element S2 in series to a DC power source 100 and outputs an output voltage Vout to a load R using both ends of a capacitor C connected in parallel thereto as an output terminal.

The high side includes a high-side insulated power source 120H and a gate driver 130H that outputs a gate signal on the basis of an output voltage of the high-side insulated power source 120H. The high-side insulated power source 120H includes a high-side inverter INV-H, an insulated transformer T-H, a high-side rectifier RECT-H, and a smoothing capacitor Cs-Hout and converts a DC voltage Vdrv-H1 to output an insulated DC voltage Vdrv-H2 from the ground. The gate driver 130H includes a high-side photo-switch PC-H that is driven with a gate signal GateH and a high-side gate driver DRV-H. The high-side gate driver DRV-H outputs the output voltage Vdrv-H2 of the high-side insulated power source 120H to the gate of the high-side switching element S1 via a driving resistor Rg-H as a driving voltage on the basis of an output signal of the high-side photo-switch PC-H.

On the other hand, the low side includes a low-side insulated power source 120L and a gate driver 130L that outputs a gate signal on the basis of an output of the low-side insulated power source 120L. The low-side insulated power source 120L includes a low-side inverter INV-L, a low-side insulated transformer T-L, a low-side rectifier RECT-L, and a smoothing capacitor Cs-Lout and converts a DC voltage Vdrv-L1 to output an insulated DC voltage Vdrv-L2 from the ground. The gate driver 130L includes a low-side photo-switch PC-L that is driven with a gate signal GateL and a low-side gate driver DRV-L. The low-side gate driver DRV-L outputs the DC voltage Vdrv-L2 of the low-side insulated power source 120L to the gate of the low-side switching element S2 via a driving resistor Rg-L as a driving voltage on the basis of an observation light of the low-side photo-switch PC-L.

In order to accelerate the response of a power conversion device, the high-side switching element S1 and the low-side switching element S2 are driven at a high frequency of several hundreds of kHz, for example. Due to this high-frequency, a high-frequency displacement voltage Vs1-s is generated in the switching element.

The high-frequency displacement voltage Vs1-s is applied to the insulated transformer T-H of the high-side insulated power source 120H as a displacement voltage of a source-side voltage to ground, of the high-side switching element. Due to the high-frequency displacement voltage Vs1-s, a leakage current flows through the parasitic capacitor Ct-H of the insulated transformer T-H.

FIGS. 14(a) and 14(b) illustrate an application voltage to the insulated transformer T-H of the high-side insulated power source 120H and a leakage current resulting from the high-frequency displacement voltage Vs1-s. On the high side, a displacement voltage having an amplitude of Vin is added to the high-frequency displacement voltage Vs1-s applied to the insulated transformer T-H using a low-side voltage VN as a reference voltage (see FIG. 14(a)). Therefore, a differential current which follows change in the high-frequency displacement voltage Vs1-s flows through the parasitic capacitor Ct-H of the insulated transformer T-H as a leakage current (see FIG. 14(b)).

On the other hand, FIGS. 14(c) and 14(d) illustrates an application voltage VN to the low-side insulated transformer T-L of the low-side insulated power source 120L and a leakage current resulting from the application voltage VN. On the low side, a high-frequency displacement voltage applied to the low-side insulated transformer T-L is not present and the low-side voltage VN is added as it is (see FIG. 14(c)). Therefore, when reference voltages VP and VN are high and low voltages obtained by full-wave rectifying voltages in a state in which the neutral point is grounded by star connection of a multi-phase power source, since a high-frequency displacement voltage is not applied to the parasitic capacitor Ct-L of the low-side insulated transformer T-L, a leakage current rarely flows through the parasitic capacitor (see FIG. 14(d)). As for the frequency components of the voltage applied to the low-side insulated transformer T-L, the frequency of the reference voltage VN is 150 Hz when an input power source is a 3-phase commercial power source (50 Hz) having a grounded neutral point, and a leakage current of the parasitic capacitor Ct-L of approximately several to several tens of pF is substantially negligible.

Therefore, a leakage current of the parasitic capacitor Ct-H of the insulated transformer T-H of the high-side insulated power source 120H can be the cause of an erroneous operation of the high-side switching element S1.

An object of the present invention is to solve the above-described conventional problems and to suppress a leakage current flowing through a parasitic capacitor of a high-side insulated power source resulting from a high-frequency displacement voltage generated due to a high-frequency operation of a switching element.

Another object of the present invention is to prevent application of a displacement voltage to an insulated transformer T-H.

Another object of the present invention is to suppress an erroneous operation of a high-side switching element of a power conversion device.

Means for Solving the Problems

The present invention suppresses a common mode current using a common mode reactor by focusing on the fact that a leakage current flowing through a parasitic capacitor of an insulated transformer of a high-side insulated power source resulting from a high-frequency signal generated due to an on/off operation of a high-side switching element is a common mode current flowing in the same direction through a high-voltage wire and a low-voltage wire that connect the high-side insulated power source and a high-side driving circuit.

The common mode reactor can be regarded as a circuit element that bears a displacement voltage generated on the high side. In this way, application of the displacement voltage to the insulated transformer T-H is prevented and a leakage current flowing through the parasitic capacitor of the insulated transformer is suppressed.

The present invention includes an embodiment of a power conversion device including the insulated power source in addition to the embodiment of the insulated power source. In any embodiment, a common mode reactor is provided in a high-voltage wire and a low-voltage wire between a high-side insulated power source and a high-side driving circuit on the high side to suppress a common mode current flowing in the same direction through both wires. In this way, a leakage current flowing through a parasitic capacitor of an insulated transformer of the high-side insulated power source is suppressed, and an erroneous operation of a high-side switching element generated due to a leakage current flowing through the parasitic capacitor of the insulated transformer is reduced.

Insulated Power Source

An insulated power source of the present invention includes: a high-side insulated power source that supplies a driving voltage to a high-side driving circuit that controls a switching operation of a high-side switching element via an insulated transformer; and a low-side insulated power source that supplies a driving voltage to a low-side driving circuit via an insulated transformer that controls a switching operation of a low-side switching element, wherein the insulated power source includes a common mode reactor between the high-side driving circuit and the high-side insulated power source. The common mode reactor bears a high-frequency displacement voltage generated due to a high-frequency operation of the switching element.

In each configuration included in the insulated power source of the present invention, the high-side insulated power source includes a high-side DC power source, a high-side inverter that converts a DC voltage of the high-side DC power source from DC to AC, a high-side insulated transformer that converts an AC output of the high-side inverter to a voltage, and a high-side rectifier that converts an AC output of the high-side insulated transformer to a DC output, which are connected in series. The high-side driving circuit includes a high-side gate driver that controls an on/off operation of the high-side switching element, a high-side photo-switch that controls the driving of the high-side gate driver, and a high-side bypass capacitor that removes noise input to the high-side photo-switch, which are connected in series.

On the other hand, the low-side insulated power source includes a low-side DC power source, a low-side inverter that converts a DC voltage of the low-side DC power source to an AC voltage, a low-side insulated transformer that converts an AC output of the low-side inverter to a voltage, and a low-side rectifier that converts an AC output of the low-side insulated transformer to a DC output, which are connected in series. The low-side driving circuit includes a low-side gate driver that controls an on/off operation of the low-side switching element, a low-side photo-switch that controls the driving of the low-side gate driver, and a low-side bypass capacitor that removes noise input to the low-side photo-switch, which are connected in series.

The common mode reactor is provided in both a high-voltage-side wire and a low-voltage-side wire that connect the high-side insulated power source and a high-side bypass capacitor of the high-side driving circuit.

Embodiment of Common Mode Reactor

According to an embodiment of the common mode reactor, a high-voltage-side wire and a low-voltage-side wire of the high-side insulated power source are wound around a common core in the same direction. The common mode reactor can be configured as a choke coil in which two lead wires are wound around one core in the same direction. As an example of a winding structure of two lead wires, a separate winding configuration in which two lead wires are separately wound around a core and a parallel winding configuration in which two lead wires are wound around a core in parallel may be used.

Since the common mode current flows in the same direction in the high-voltage-side wire and the low-voltage-side wire of the high-side insulated power source, magnetic fluxes generated in the core of the common mode reactor are combined and an inductance increased due to a strengthening self-induction effect. With increase in the inductance, an electrical resistance to the high-frequency common mode current increases, and an effect of inhibiting passage of the common mode current occurs. Due to the effect of inhibiting passage of the common mode current, a leakage current flowing through the parasitic capacitor of the insulated transformer is suppressed.

The common mode reactor is configured as a core independent from an inductance included in a main circuit such as a chopper circuit. When the core of the common mode reactor is not shared with but independent from the core of the inductance of a main circuit, magnetic saturation of the core of the common mode reactor by a main current of the main circuit can be prevented. In this way, it is possible to reduce the size of the core of the common mode reactor.

Furthermore, since the core of the common mode reactor is independent from the core included in the main circuit, an inductance value of the core of the common mode reactor can be set arbitrarily without being dependent on the core of the main circuit, and all displacement voltages can be borne by the common mode reactor.

Moreover, by decreasing the diameter of the windings wound around the core of the common mode reactor and increasing the number of windings, it is possible to suppress the magnetic saturation of the core by the voltage-time product (Bm).

An embodiment of the common mode reactor includes a configuration in which a damping resistance is connected in series to both the high-voltage-side wire and the low-voltage-side wire of the high-side insulated power source. When the degree of coupling of two coils that form the common mode reactor is smaller than 1, a leakage inductance occurs. The leakage inductance forms a resonance circuit together with a capacitor included in the insulated power source or the driving circuit (a gate driver). The damping resistance damps a resonance current generated due to a resonance phenomenon between a capacitor and the leakage inductance of the two coils that form the common mode reactor to suppress resonance.

Bias Power Source

The insulated power source includes a configuration in which a bias power source that magnetically resets the core of the common mode reactor is connected to a low voltage side of the high-side insulated power source. The bias power source suppresses the magnetic saturation of the core of the common mode reactor.

The switching element which is turned on and off by the high-side insulated power source generates a high-frequency displacement voltage Vs1-$s$ due to the on/off operation thereof. The high-frequency displacement voltage Vs1-$s$ is applied to the common mode reactor provided in order to reduce the common mode current. On the other hand, a low-frequency voltage only is applied to a parasitic capacitor Ct-H of the insulated transformer included in the high-side insulated power source.

The reference potential of the high-side insulated power source is in a floating state for insulation from the low-side insulated power source. Therefore, the high-frequency displacement voltage Vs1-$s$ applied to the common mode reactor is superimposed on the reference potential in the floating state, and the magnetization state of the core of the common mode reactor varying depending on the displacement voltage Vs1-$s$ depends on the reference potential.

The bias power source of the present invention adjusts the potential of the high-frequency displacement voltage Vs1-$s$ with respect to the reference potential of the high-side insulated power source to equalize the voltage-time products in the positive and negative directions of the core of the common mode reactor to realize magnetic reset to suppress the magnetic saturation of the core.

The bias voltage of the bias power source is set to the output voltage of an output circuit such as a chopper circuit driven by the insulated power source. In this way, the reference voltage of the high-frequency displacement voltage Vs1-$s$ applied to the common mode reactor is adjusted on the basis of the output voltage. When the reference voltage of the displacement voltage Vs1-$s$ is adjusted by the bias power source, voltage-time products having the opposite polarities and the same magnitude are applied to the common mode reactor, and the magnetic reset is realized.

In addition to an embodiment in which the output voltage of the output circuit is used as the bias voltage, an embodiment in which a voltage corresponding to the output voltage of the output circuit is used as the bias voltage may be used.

Instead of an embodiment in which the output circuit itself is used as the bias power source, an embodiment in which a separate power source that outputs the same voltage as the output voltage of the output circuit is used as the bias power source may be used. This separate power source generates the same voltage as the output voltage of the output circuit on the basis of the duty ratio of a control signal for driving the switching element.

Power Conversion Device

A power conversion device including the insulated power source of the present invention includes an embodiment of a DCDC converter and an embodiment of a DCAC inverter. Furthermore, the DCDC converter may be configured such that a step-down chopper circuit or a step-up chopper circuit is used as a chopper circuit that performs DCDC conversion.

Embodiment of DCDC Step-Down Chopper Converter

A DCDC converter including a step-down chopper circuit includes: an insulated power source in which a step-down chopper circuit in which a series-parallel connection circuit of a high-side switching element and a low-side switching element and an inductance are connected in series to a DC power source forms a main circuit, and which supplies a DC voltage to a high-side driving circuit that drives a high-side switching element and a low-side driving circuit that drives a low-side switching element.

The insulated power source is a power source that drives a high-side driving circuit and a low-side driving circuit that drive the high-side switching element and the low-side switching element, respectively, and includes a common mode reactor between the high-side insulated power source and the high-side driving circuit on the high side. An output voltage of the step-down chopper circuit can be used as the bias voltage of the bias power source.

Embodiment of DCDC Step-Up Chopper Converter

A DCDC converter including a step-up chopper circuit includes an insulated power source in which a step-up chopper circuit in which an inductance and a series-parallel connection circuit of a high-side switching element and a low-side switching element are connected in series to a DC power source forms a main circuit and which supplies a DC voltage to a high-side driving circuit that drives a high-side switching element and a low-side driving circuit that drives a low-side switching element.

The insulated power source is a power source that drives a high-side driving circuit and a low-side driving circuit that drive the high-side switching element and the low-side switching element, respectively, and includes a common mode reactor between the high-side insulated power source and the high-side driving circuit on the high side. An input voltage of the step-up chopper circuit can be used as the bias voltage of the bias power source.

In the embodiment of the DCDC step-down chopper converter and the embodiment of the DCDC step-up chopper converter, the high side and the low side of the converter each may include a multi-phase interleaved configuration for one common insulated power source.

In this multi-phase configuration, a high-side multi-phase configuration includes a plurality of high-side switching elements connected in parallel. The same voltage is applied to the plurality of high-side switching elements from the one common high-side insulated power source via the common mode reactor. When the same voltage is applied to the respective high-side switching elements, it is possible to equalize the ON resistances of the respective high-side switching elements and make the outputs of the respective phases equal.

Embodiment of DCAC Inverter

A DCAC inverter includes an insulated power source in which an inverter circuit formed of a bridge circuit of a high-side switching element and a low-side switching element with respect to a DC power source forms a main circuit and which supplies a DC voltage to a high-side driving circuit that drives the high-side switching element and a low-side driving circuit that drives the low-side switching element.

The insulated power source is a power source that drives a high-side driving circuit and a low-side driving circuit that drive the high-side switching element and the low-side switching element, respectively, and includes a common mode reactor between the high-side insulated power source and the high-side driving circuit on the high side. As the bias voltage of the bias power source, ½ of an input voltage of the main circuit of the inverter circuit can be used.

In the embodiment of the DCAC inverter, the bridge circuit includes a plurality of switching elements connected in parallel to one insulated power source common to the high side and the low side. The same voltage is supplied from one common high-side insulated power source to the plurality of high-side switching elements via the common mode reactor. By applying the same voltage to the respective high-side switching elements, it is possible to equalize the ON resistances of the high-side switching elements and suppress a variation in the output voltage.

Moreover, according to the present invention, in a power conversion device in which a main circuit includes a plurality of high-side switching elements, since the common mode reactor and the bias power source are used in the high-side circuit, the insulated power source can be shared in common.

BRIEF DESCRIPTION OF THE DRAWINGS

FIGS. 2(a) to 2(c) are diagrams for describing a voltage state of each portion of the power conversion device.

DESCRIPTION OF THE PREFERRED EMBODIMENTS

Figure 9:
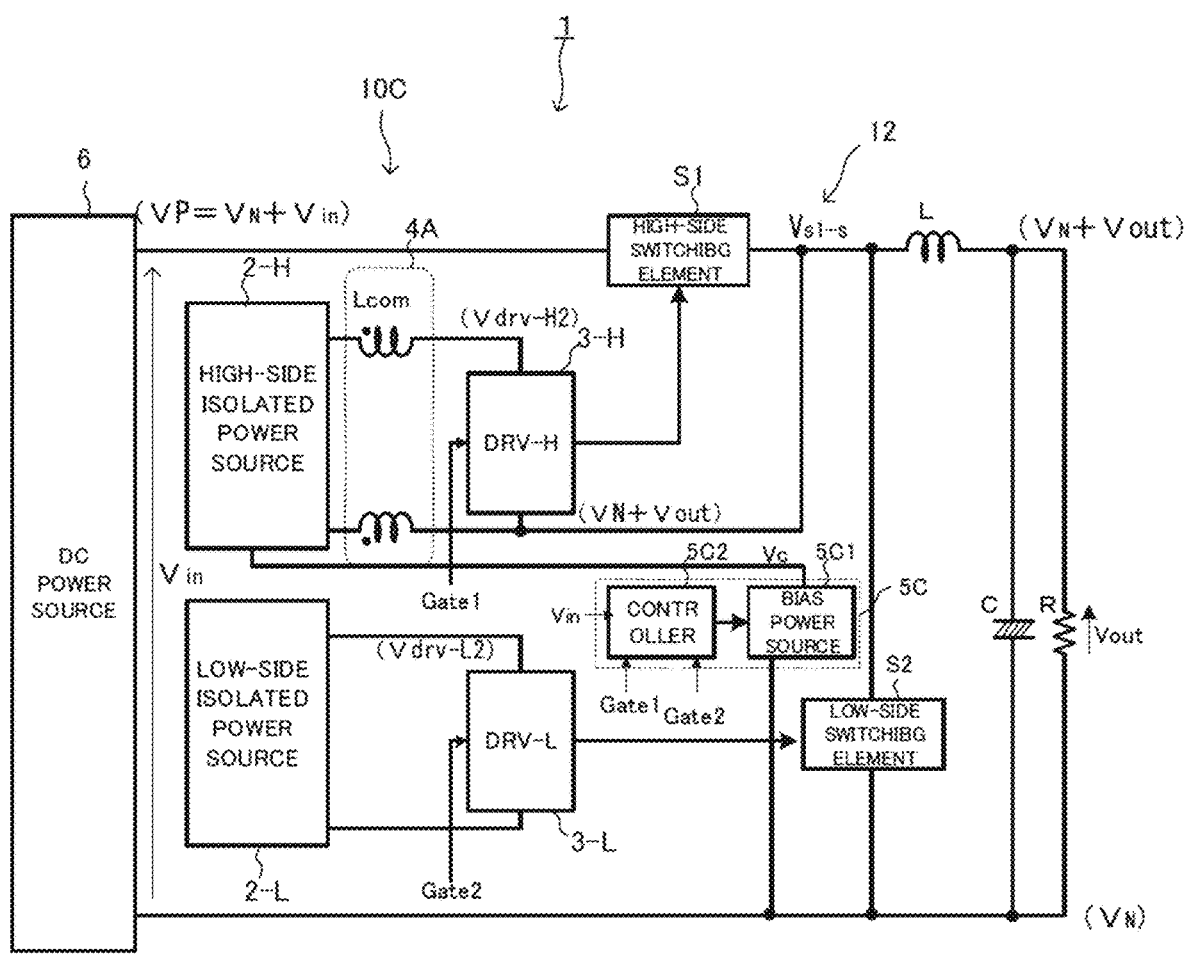
FIG. 9 is a schematic block diagram for describing a third configuration example of the present invention.
Figure 10:
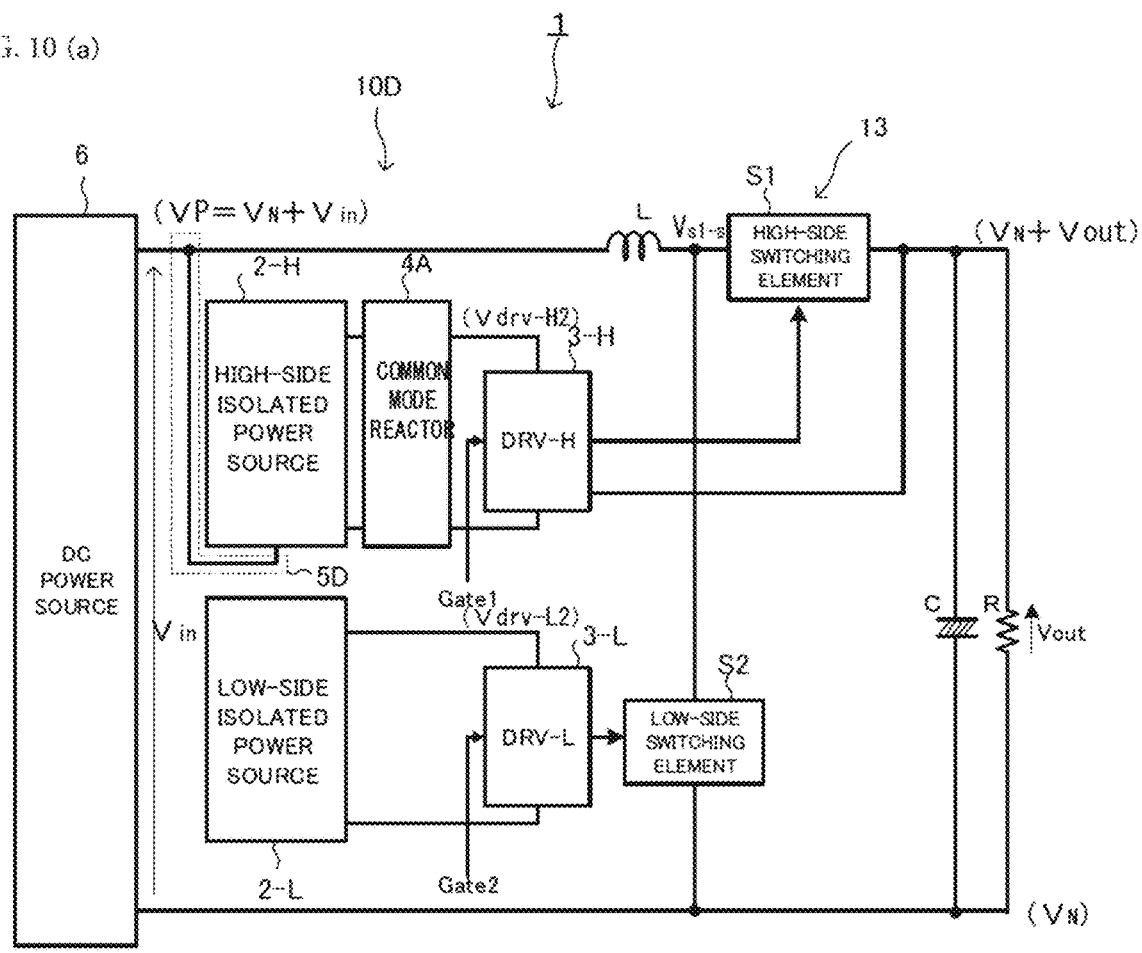
FIGS. 10(a) and 10(b) are circuit examples for describing a DCDC converter in which a step-up chopper circuit according to a fourth configuration example of the present invention is used as a main circuit.
Figure 10:
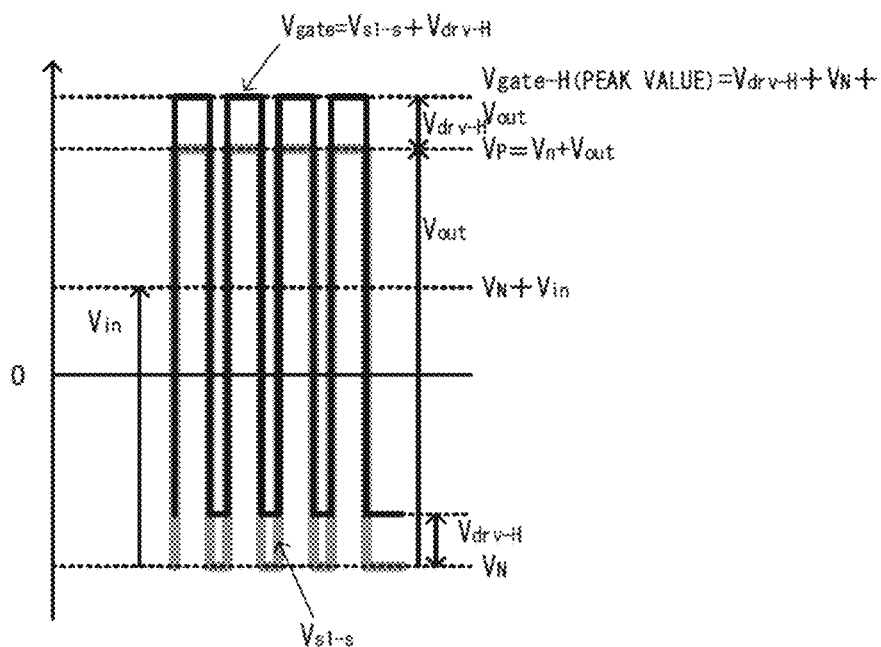
Figure 11:
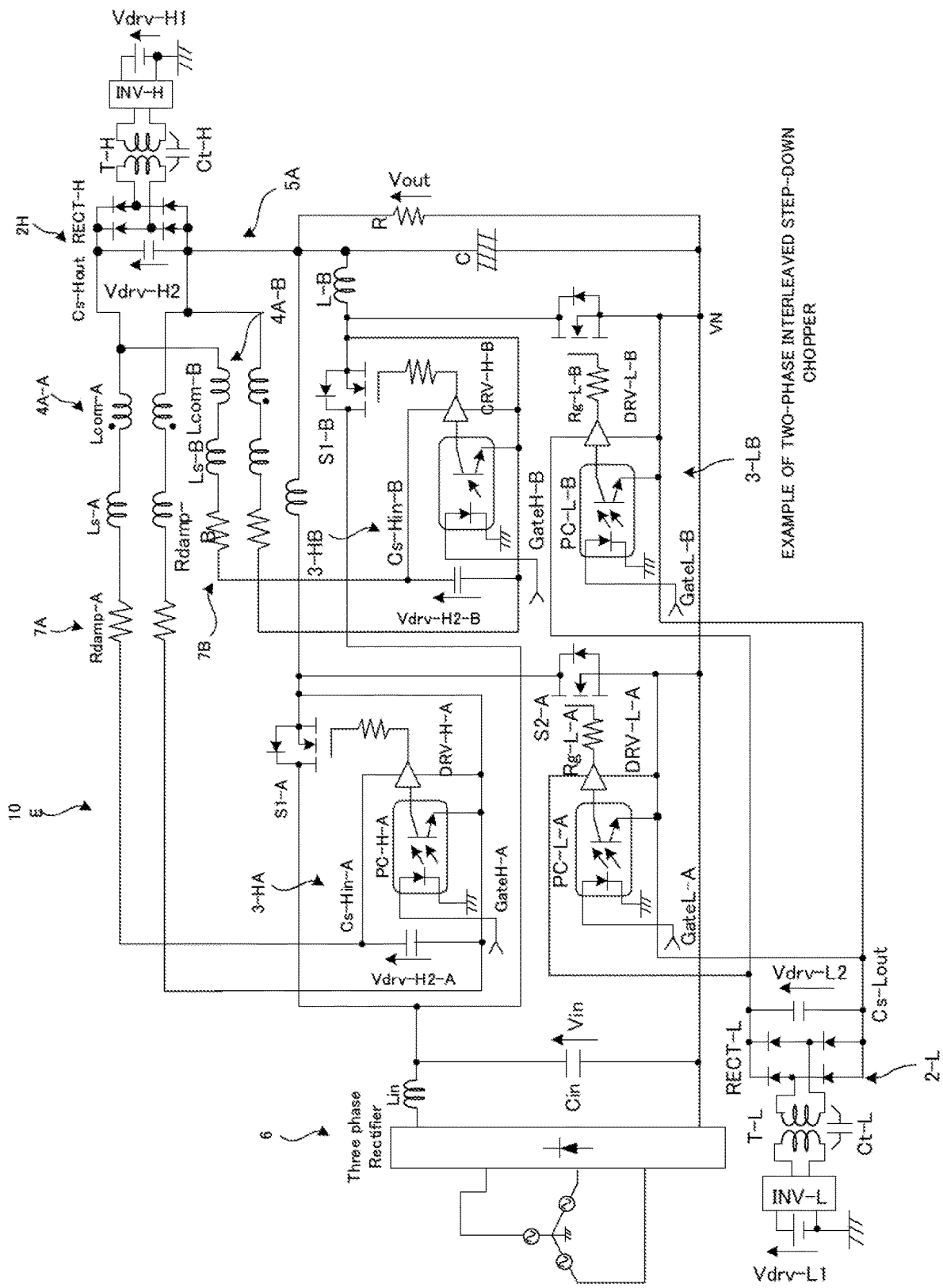
FIG. 11 is a circuit example for describing an interleaved configuration of a DCDC converter according to a fifth configuration example of the present invention.
Figure 12:
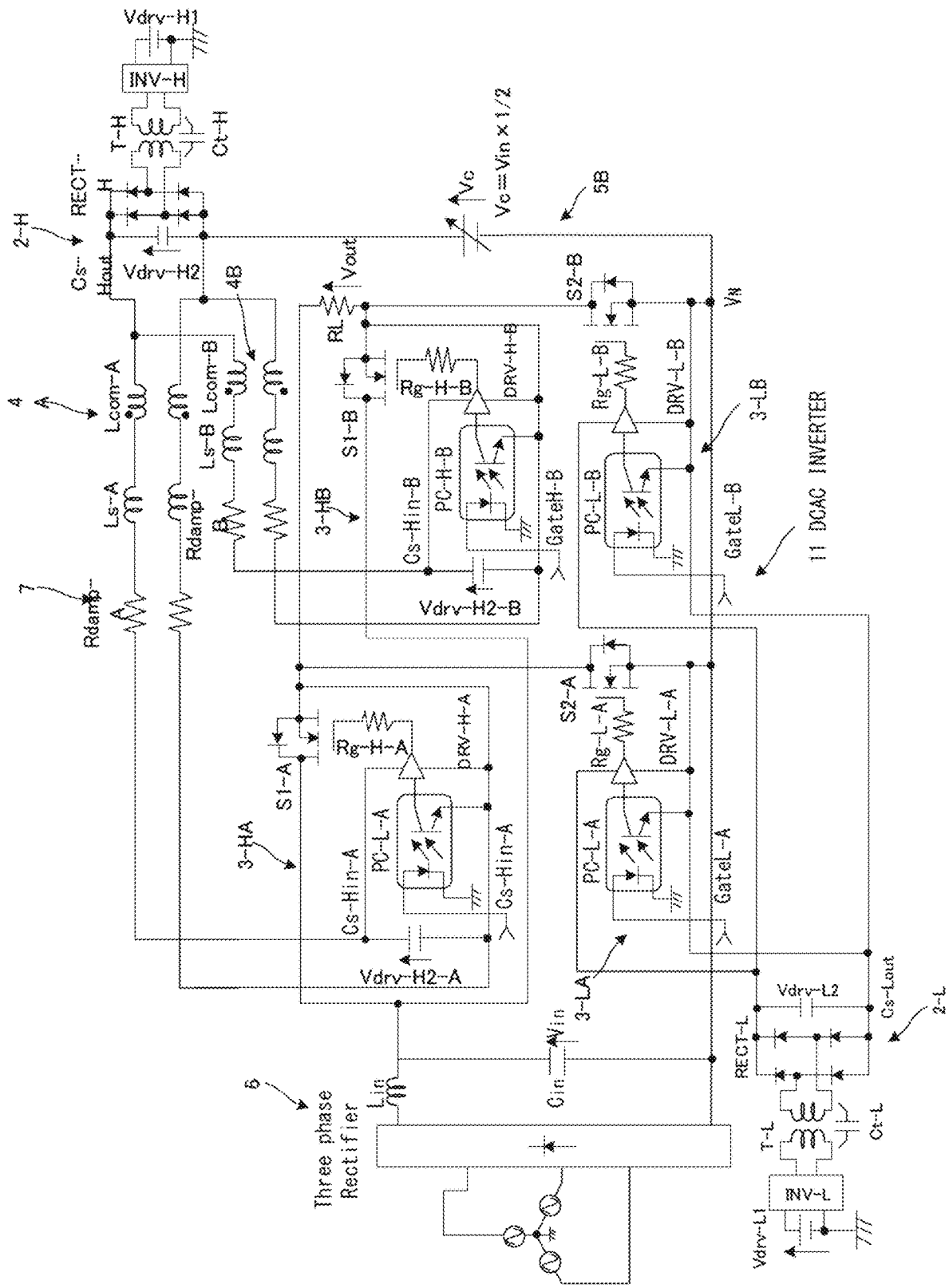
FIG. 12 is a circuit example for describing an interleaved configuration of a DCAC converter according to a sixth configuration example of the present invention.
Figure 13:
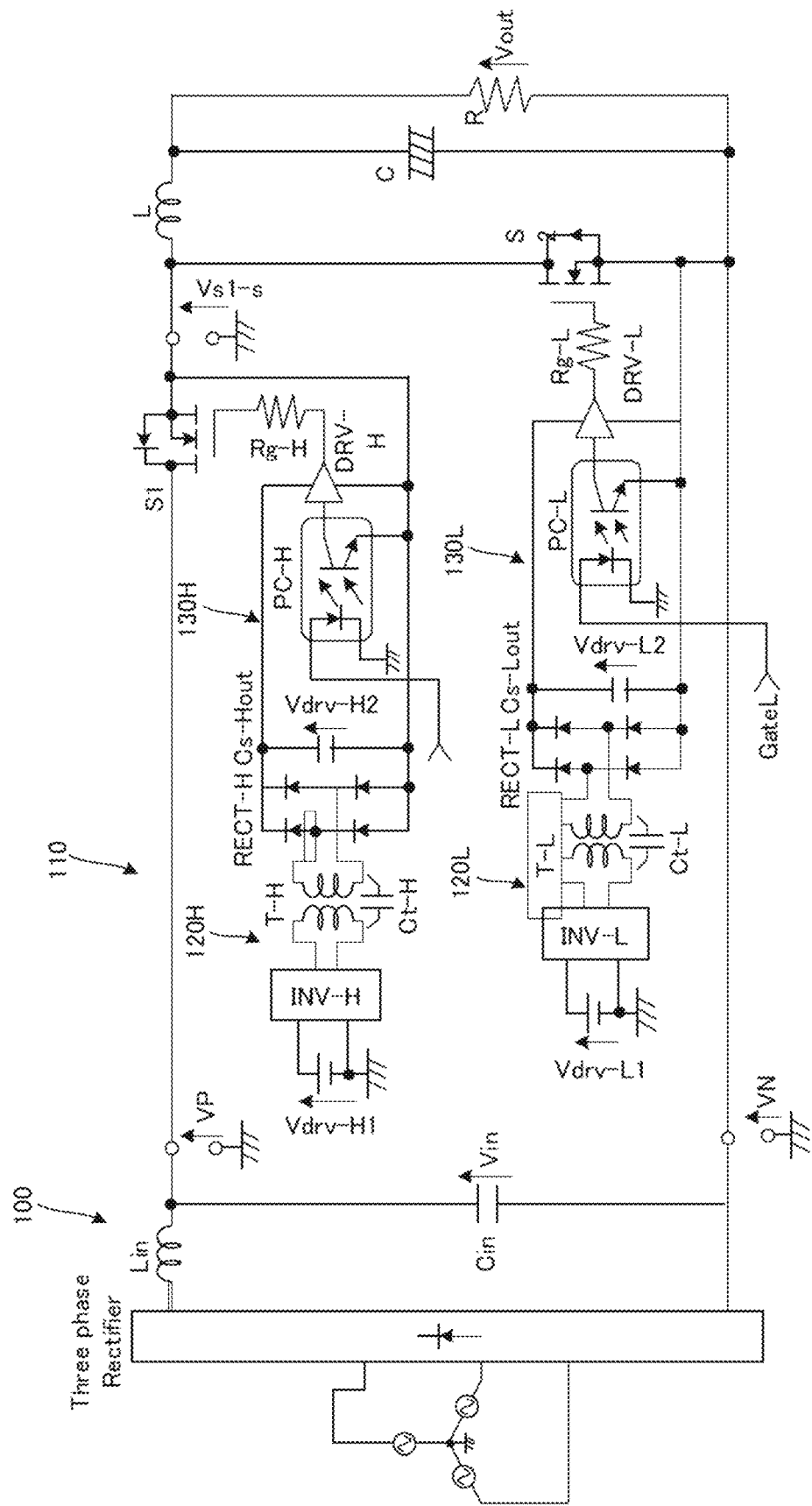
FIG. 13 is a diagram for describing an example of a conventional power conversion device.
Figure 14:
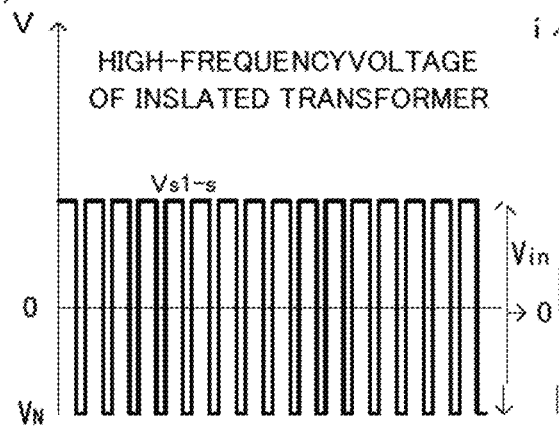
FIGS. 14(a) to 14(d) are diagrams for describing an application voltage to an insulated transformer of an insulated power source and a leakage current resulting from a high-frequency displacement voltage.
Figure 14:
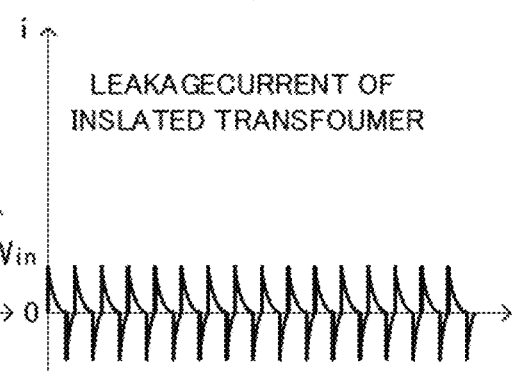
Figure 14:
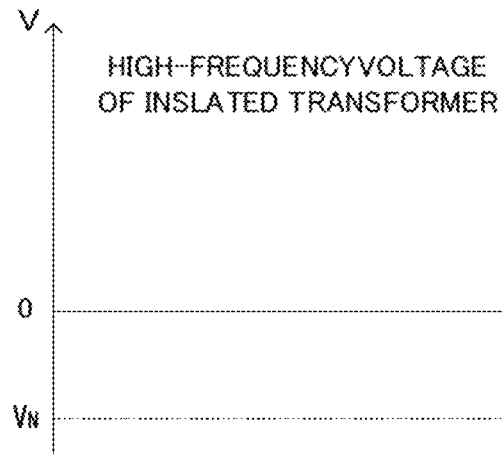
Figure 14:
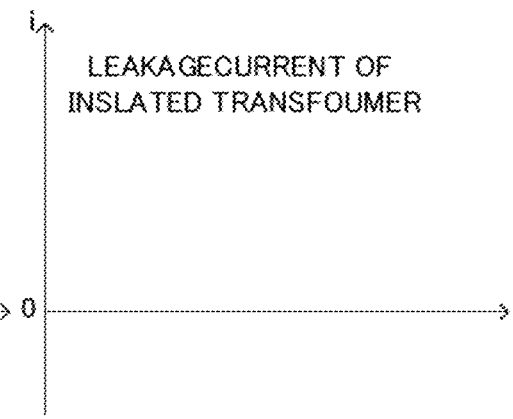

An insulated power source and a power conversion device according to the present invention will be described with reference to FIGS. 1(a) to 1(d) to FIG. 12. Hereinafter, a schematic configuration of the insulated power source and the power conversion device according to the present invention, the voltage state of each portion, and magnetic reset will be described with reference to FIGS. 1(a) to 1(d) to FIGS. 4(a) and 4(b), and a configuration example of the power conversion device of a DCDC converter will be described with reference to FIG. 5 to FIGS. 10(a) and 10(b). FIGS. 5 to 9, and FIG. 11 illustrate configuration examples of a DCDC converter in which a step-down chopper circuit is used as a main circuit, and FIGS. 10(a) and 10(b) illustrate configuration examples of a DCDC converter in which a step-up chopper circuit is used as a main circuit. FIG. 11 illustrates a configuration example of a DCDC converter in which a main circuit of a step-down chopper circuit is configured as a multi-phase circuit by interleaving and FIG. 12 illustrates a configuration example of a power conversion device of a DCAC inverter.

Schematic Configuration of Insulated Power Source and Power Conversion Device of Present Invention First, a schematic configuration of an insulated power source and a power conversion device according to the present invention will be described with reference to FIGS. 1(a) to 1(d). The power conversion device illustrated in FIGS. 1(a) to 1(d) illustrates a configuration example of a DCDC converter in which a step-down chopper circuit is used as a main circuit.

A DCDC converter 10 converts an input voltage Vin from a DC power source 6 to output an output voltage Vout using a step-down chopper circuit 12 as a main circuit. The step-down chopper circuit 12 includes a series-parallel circuit of a high-side switching element S1 and a low-side switching element S2 and a series-parallel circuit of an inductance L and a smoothing capacitor C and supplies the output voltage Vout at both ends of the smoothing capacitor C to a load resistance R.

The high side includes a high-side insulated power source 2-H and a high-side driving circuit (a gate driver) 3-H as a configuration that controls a switching operation of the high-side switching element S1. On the other hand, the low side includes a low-side insulated power source 2-L and a low-side driving circuit (a gate driver) 3-L as a configuration that controls a switching operation of the low-side switching element S2. A reference voltage of the high-side insulated power source 2-H and a reference voltage of the low-side insulated power source 2-L are different and are insulated from each other.

On the low side, the low-side driving circuit (the gate driver) 3-L receives a driving voltage Vdrv-L2 from the low-side insulated power source 2-L and applies the driving voltage Vdrv-L2 to a gate electrode of the low-side switching element S2 on the basis of a gate signal Gate2 to drive the low-side switching element S2.

On the other hand, on the high side, the high-side driving circuit (the gate driver) 3-H receives a driving voltage Vdrv-H2 from the high-side insulated power source 2-H and applies the driving voltage Vdrv-H2 to a gate electrode of the high-side switching element S1 on the basis of a gate signal Gate1 to drive the high-side switching element S1. The high side includes a common mode reactor 4 between the high-side insulated power source 2-H and the high-side driving circuit (the gate driver) 3-H.

When the high-side switching element S1 is turned on and off at a high frequency, a high-frequency displacement voltage Vs1-s is generated. The high-frequency displacement voltage Vs1-s is applied to be superimposed on a voltage VN as a displacement voltage of a source-side voltage to ground, of the high-side switching element S1 in the insulated transformer T-H (not illustrated in FIGS. 1(a) to 1(d)) included in the high-side insulated power source 2-H. Due to this high-frequency displacement voltage Vs1-s, a very small leakage current flows through a parasitic capacitor Ct-H of the insulated transformer T-H. The leakage current of the parasitic capacitor Ct-H of the insulated transformer T-H can be the cause of an erroneous operation of the high-side switching element S1.

The common mode reactor 4 provided on the high side bears the high-frequency displacement voltage Vs1-s generated when the high-side switching element S1 is turned on and off at a high frequency. In this way, the common mode reactor 4 prevents the displacement voltage Vs1-s from being applied to the parasitic capacitor Ct-H of the insulated transformer T-H of the high-side insulated power source 2-H to thereby reduce a leakage current and suppress an erroneous operation of the high-side switching element S1.

The leakage current flowing through the parasitic capacitor of the insulated transformer of the high-side insulated power source due to the high-frequency displacement voltage generated by the on/off operation of the high-side switching element is a common mode current flowing in the same direction in a high-voltage wire and a low-voltage wire that connect the high-side insulated power source and the high-side driving circuit. The common mode reactor 4 reduces the common mode current.

Figure 1A:
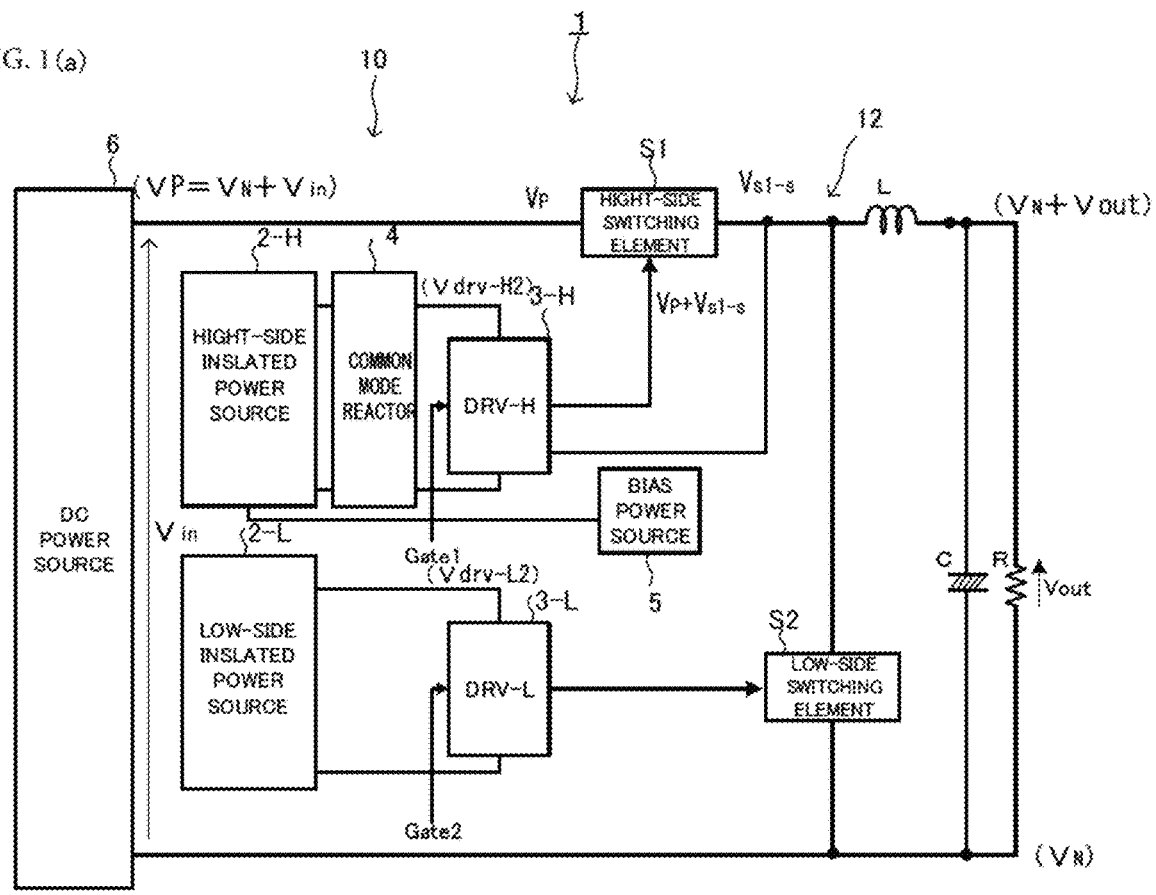
FIGS. 1(a) to 1(d) are diagrams for describing a schematic configuration of an insulated power source and a power conversion device according to the present invention.
Figure 1B:
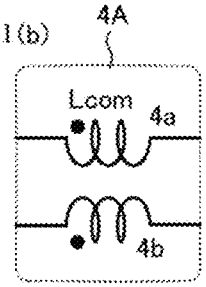
Figure 1C:
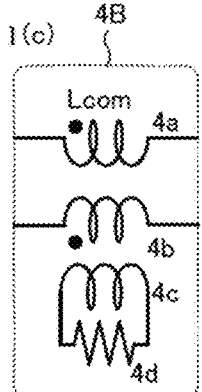
Figure 1D:
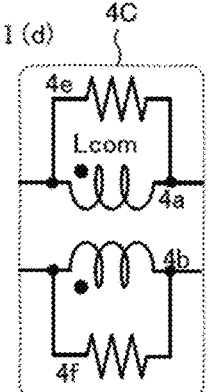

The common mode reactor 4 includes a plurality of embodiments. FIGS. 1(b), 1(c), and 1(d) illustrate configuration examples of the common mode reactor.

Common Mode Reactor

The common mode reactor includes a common core and two coils wound around the common core in the same direction. Common mode reactors 4A, 4B, and 4C illustrated in FIGS. 1(b), 1(c), and 1(d) are formed such that a high-voltage-side wire and a low-voltage-side wire of a high-side insulated power source are wound around a common core (not illustrated) in the same direction. As an example of a winding structure of two lead wires, a separate winding configuration in which two lead wires are separately wound around a core and a parallel winding configuration in which two lead wires are wound around a core in parallel may be used.

Since the common mode current flows in the same direction in the high-voltage-side wire and the low-voltage-side wire of the high-side insulated power source, magnetic fluxes generated in the core are combined and an inductance increased due to a strengthening self-induction effect. With increase in the inductance, an electrical resistance to the high-frequency common mode current increases, and an effect of inhibiting passage of the common mode current occurs. Due to the effect of inhibiting passage of the common mode current and the bearing of the displacement voltage Vs1-s by the common mode reactor, application of the displacement voltage to the parasitic capacitor of the insulated transformer is prevented and a leakage current flowing through the parasitic capacitor of the insulated transformer is suppressed.

The common mode reactors 4A, 4B, and 4C are configured as a core independent from the inductance L included in a main circuit of a chopper circuit or the like. When the core (not illustrated) of the common mode reactor 4A, 4B, or 4C is not shared with but independent from the core (not illustrated) of the inductance L of the main circuit of the chopper circuit, magnetic saturation of the cores of the common mode reactors 4A, 4B, and 4C by a main current of the main circuit of the chopper circuit can be prevented. In this way, it is possible to reduce the size of the cores of the common mode reactors 4A, 4B, and 4C.

Moreover, when the core of the common mode reactor is independent from the core of the inductance L of the main circuit of the chopper circuit, the inductances of the respective cores can be determined separately. Furthermore, when the diameter of the windings wound around the cores of the common mode reactors 4A and 4B is decreased to increase the number of windings, the inductance can be set arbitrarily. Furthermore, since the voltage-time product (Bm) can be set arbitrarily, it is possible to suppress magnetic saturation of the core.

The common mode reactor 4A is formed by winding primary windings 4a and 4b in the same direction around a common core (not illustrated). The common mode reactor 4B includes a secondary winding 4c short-circuited by a resistor 4d in addition to the primary windings 4a and 4b wound around the common core similarly to the common mode reactor 4A. The secondary winding 4c induces a common mode current of the primary windings 4a and 4b so that the common mode current is consumed by the resistor 4d.

The common mode reactor 4C includes resistors 4e and 4f that short-circuit the primary windings 4a and 4b in addition to the primary windings 4a and 4b wound around the common core similarly to the common mode reactor 4A. The resistors 4e and 4f consume and reduce the common mode current of the primary windings 4a and 4b.

On the other hand, the high-frequency displacement voltage applied to the low-side insulated transformer T-L (not illustrated in FIGS. 1(a) to 1(d)) of the low-side insulated power source 2-L is the low-side voltage VN only. When the voltages VP and VN are high and low voltages obtained by grounding the neutral point with star connection of a multi-phase power source, since a low-frequency voltage VN only is applied to the parasitic capacitor Ct-L of the low-side insulated transformer T-L, a leakage current is very small. As for the frequency components of the voltage applied to the low-side insulated transformer T-L, the frequency of the reference voltage VN is 150 Hz when an input power source is a 3-phase commercial power source (50 Hz) having a grounded neutral point, and a leakage current of the parasitic capacitor Ct-L of approximately several to several tens of pF is substantially negligible.

Bias Power Source

The low-side insulated power source 2-L has the voltage VN as a reference voltage whereas the high-side insulated power source 2-H is in a floating state of being insulated from the low-side insulated power source 2-L.

The reference voltage of the high-side insulated power source 2-H is determined on the basis of a source voltage of the high-side switching element S1.

In the DCDC converter 10 which is the power conversion device 1 of the present invention, the high-side insulated power source 2-H includes a bias power source 5 connected to the low voltage side. The bias power source 5 adjusts a bias voltage of the high-frequency displacement voltage Vs1-s applied to the common mode reactor. With the adjustment of the bias voltage by the bias power source 5, the core of the common mode reactor is magnetically reset and the magnetic saturation of the core is suppressed. The magnetic reset of the core by the bias power source will be described later.

Voltage State of Each Portion of Power Conversion Device

Next, a voltage state of each portion of the power conversion device will be described with reference to FIGS. 2(a) to 2(c) and FIG. 3.

FIGS. 2(a) to 2(c) each illustrate a case in which a power source including a 3-phase commercial power source (50 Hz) having a grounded neutral point and a rectifier and a smoothing circuit that rectify an AC voltage of the 3-phase commercial power source to output a DC voltage is used as a DC power source, and the DC voltage obtained by the DC power source is used as an input voltage Vin of the power conversion device. FIG. 2(a) illustrates variations in respective voltages of the voltage VP of a positive voltage terminal of the DC power source and the voltage VN of a negative voltage terminal and the voltage (VN+Vout) of the output terminal as the voltage of each portion of the power conversion device and FIG. 2(b) illustrates a variation in the high-frequency displacement voltage Vs1-s. FIG. 2(c) illustrates a voltage state of the respective voltages VP, VN+Vout, VN, and Vs1-s at an arbitrary time point in FIG. 2(b).

Among the voltages of the output terminal of the DC power source, the voltage VN of the negative voltage terminal is a low-side reference voltage of the power conversion device, and the voltage VP of the positive voltage terminal is a voltage (VN+Vin) which is an addition of the reference voltage VN and the input voltage Vin.

The voltage of the output terminal of the power conversion device is (VN+Vout) which is an addition of the reference voltage VN and the output voltage Vout, and is in a relation of VP (=VN+Vin)>(VN+Vout) when the main circuit of the power conversion device is formed of a step-down chopper circuit.

The output voltage of the DC power source that rectifies the AC voltage of the 3-phase commercial power source to output a DC voltage has a frequency of 150 Hz when the frequency of each commercial power source is 50 Hz, and the frequency of the voltages VN and VP is 150 Hz. In the case of an S-phase grounded power source, the frequency of the voltages VN and VP is 50 Hz.

The high-frequency displacement voltage Vs1-s generated when the high-side switching element S1 and the low-side switching element S2 are driven at a high frequency has the same amplitude as the input voltage Vin and is represented by a voltage state which is added using the reference voltage VN as a base.

Figure 3:
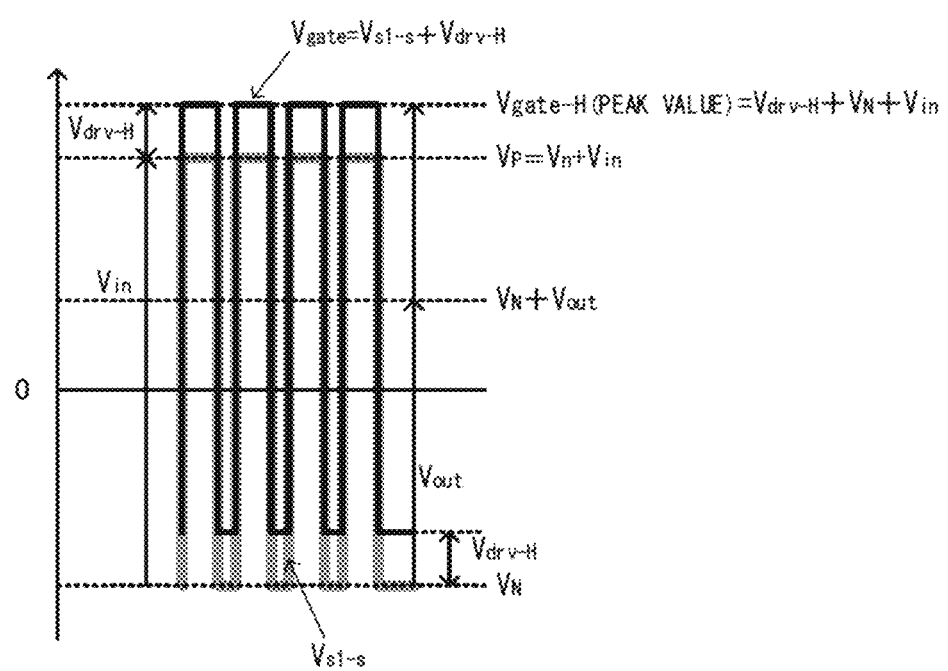
FIG. 3 is a diagram for describing a voltage state of each portion of the power conversion device.

FIG. 3 illustrates the voltage states of the voltage VP (=VN+Vin) of the positive voltage terminal, the output voltage (VN+Vout) of the output terminal, and the voltage (Vdrv-H+Vs1-s) of a gate driver signal that drives the gate of the high-side switching element S1 in a state in which the voltage VN of the negative voltage terminal is used as a reference voltage. Since the voltage of the gate driver signal needs to be higher than the voltage of the output side (source side) of the high-side switching element S1, the reference voltage of the high-side insulated power source 2-H is set to Vs1-s, and a voltage (Vdrv-H+VN+Vin) of which the peak voltage is a voltage (Vdrv-H+Vs1-s) which is an addition of the reference voltage Vs1-s and the voltage Vdrv-H is used as the gate driver signal Vgate-H. The amplitudes of the voltages illustrated in FIG. 3 are schematically depicted for the sake of description and are different from the actual voltage amplitudes.

Magnetic Reset

In each embodiment of the common mode reactor, the bias power source 5 magnetically resets the core of the common mode reactor to suppress the magnetic saturation of the core of the common mode reactor.

The high-side switching element S1 which is turned on and off by the high-side insulated power source 2-H generates the high-frequency displacement voltage Vs1-s due to the on/off operation thereof. The high-frequency displacement voltage Vs1-s is applied to the common mode reactor. On the other hand, a low-frequency voltage only is applied to the parasitic capacitor Ct-H of the insulated transformer included in the high-side insulated power source 2-H.

The reference potential of the high-side insulated power source 2-H is in a floating state for insulation from the low-side insulated power source 2-L. Therefore, the high-frequency displacement voltage Vs1-s applied to the common mode reactor is superimposed on the reference potential in the floating state, and the magnetization state of the core of the common mode reactor varying depending on the displacement voltage Vs1-s depends on the reference potential.

The bias power source 5 adjusts the potential of the high-frequency displacement voltage Vs1-s with respect to the reference potential of the high-side insulated power source 2-H to equalize the voltage-time products in the positive and negative directions of the core of the common mode reactor to realize magnetic reset to suppress the magnetic saturation of the core.

The bias voltage of the bias power source 5 is set to an output voltage of an output circuit of a chopper circuit or the like driven by an insulated power source. In this way, the reference potential of the high-frequency displacement voltage Vs1-s applied to the common mode reactor is adjusted on the basis of the output voltage. When the reference potential of the displacement voltage Vs1-s is adjusted by the bias power source, voltage-time products having the opposite polarities and the same magnitude are applied to the common mode reactor.

Figure 4:
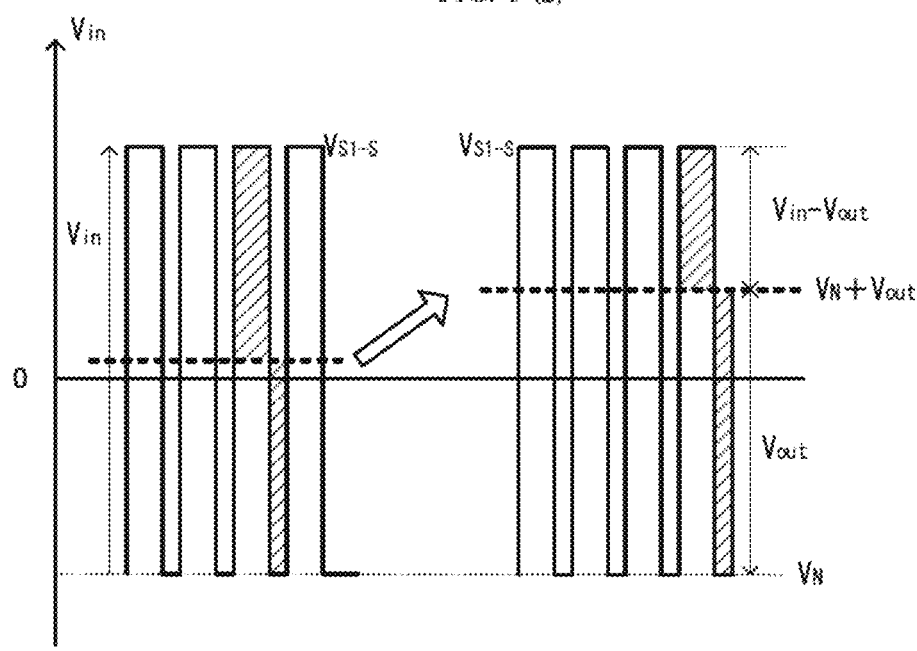
FIGS. 4(a) and 4(b) are schematic diagrams for describing adjustment of a high-frequency displacement voltage Vs1-s by a bias power source.

FIGS. 4(a) and 4(b) are schematic diagrams for describing the adjustment of the potential of the high-frequency displacement voltage Vs1-s by the bias power source 5. The voltage amplitudes and the voltages of each portion illustrated in FIGS. 4(a) and 4(b) are schematically illustrated for the sake of description and are different from the actual voltage amplitudes or voltage states.

FIG. 4(a) illustrates a potential state of the high-frequency displacement voltage Vs1-s applied to the common mode reactor. In the potential state illustrated in FIG. 4(a), since the bias voltage is set to ½ of the input voltage Vin as an example, the displacement voltage Vs1-s in which the voltage-time product in the positive direction is larger than that in the negative direction is applied to the common mode reactor, and the magnetic reset of the core is not realized.

FIG. 4(b) illustrates a state in which the potential of the high-frequency displacement voltage Vs1-s applied to the common mode reactor is changed on the basis of the reference voltage VN by the bias power source. Due to the potential change, the reference potential of the common mode reactor is (VN+Vout). (VN+Vout) is illustrated using a bold broken line in FIG. 4(b).

Due to this, the displacement voltage Vs1-s in which the voltage-time products have the same area in both the positive and negative directions with respect to the reference potential (VN+Vout) is applied to the core of the common mode reactor.

When the main circuit of the power conversion device is a step-down chopper circuit, an output voltage Vout of the step-down chopper circuit is represented by Vout=Vin×Duty. Duty is a duty ratio of the high-side switching element S1 and indicates the ratio of time in which the high-side switching element S1 is in the ON state with respect to one cycle.

When the driving of the high-side switching element S1 is controlled by this Duty, the voltage of (Vin−Vout) is applied to the common mode reactor in the period of Duty when the high-side switching element S1 is in the ON state and the voltage of Vout with the potential in a reverse direction is applied to the common mode reactor in the period of (1-Duty) when the high-side switching element S1 is in the ON state.

In a period in which the high-side switching element S1 is in the ON state, the voltage application state is represented by the following voltage-time product Bm.

$$BM\text{-on} = (Vin - Vout) \times \text{Duty} \quad (1)$$
$$= (Vin - Vin \times \text{Duty}) \times \text{Duty}$$
$$= Vin \times (1 - \text{Duty}) \times \text{Duty}$$

On the other hand, in a period in which the high-side switching element S1 is in the OFF state, the voltage application state is represented as follows.

$$BM\text{-off} = (-Vout \times (1 - \text{Duty})) \quad (2)$$
$$= -Vin \times (1 - \text{Duty}) \times \text{Duty}$$

The entire displacement voltage Vs1-s is applied to the common mode reactor, and a low-frequency voltage of (VN+Vout) only is applied to the parasitic capacitor Ct-H of the insulated transformer T-H of the high-side insulated power source 2-H.

As for the displacement voltage Vs1-s applied to the common mode reactor, as illustrated in Equations (1) and (2), since the voltage-time product Bm-on applied to the core in the ON state of the high-side switching element S1 and the voltage-time product Bm-off applied to the core in the OFF state of the high-side switching element S1 have the opposite polarities and the same magnitude, the core of the common mode reactor is magnetically reset.

On the other hand, the leakage current resulting from the low-frequency voltage of (VN+Vout) applied to the parasitic capacitor Ct-H of the insulated transformer T-H is substantially negligible since the parasitic capacitor Ct-H is as small as approximately several to several tens of pF, for example.

Suppression of Resonance Phenomenon of High-Side Insulated Power Source

Next, a configuration for suppressing a resonance phenomenon occurring in the high-side insulated power source will be described. When the degree of coupling of the two windings 4a and 4b that form the common mode reactors 4A and 4B is smaller than 1, a leakage inductance Ls (not illustrated in FIG. 1) occurs. The leakage inductance Ls forms a resonance circuit together with capacitors included in the driving circuit (the gate driver) 3-H and the high-side insulated power source 2-H.

Examples of the capacitors that form the resonance circuit include a smoothing capacitor included in the high-side insulated power source 2-H connected to the common mode reactors 4A and 4B and a bypass capacitor included in the driving circuit (the gate driver) 3-H. The bypass capacitor has a filtering effect of bypassing an AC component to inhibit entrance of noise components into the driving circuit (the gate driver) 3-H.

In these capacitors, since a capacitor having a large capacitance such as an electric-field capacitor is generally used as a smoothing capacitor provided after rectification of a high-side insulated power source, such a capacitor is negligible as the capacitor that forms the resonance circuit. On the other hand, since a bypass capacitor provided when a photo-coupler is used for insulation of the driving circuit (the gate driver) uses a capacitor having a small capacitance such as a ceramic capacitor, such a capacitor is not negligible as the capacitor that forms the resonance circuit.

The common mode reactors 4A and 4B can be configured such that a damping resistance 7 (not illustrated in FIGS. 1(a) to 1(d)) is connected in series to both the high-voltage-side wire and the low-voltage-side wire of the high-side insulated power source 2-H. The damping resistance 7 damps a resonance current generated due to a resonance phenomenon between a capacitor and the leakage inductance Ls of the two windings 4a and 4b that form the common mode reactors 4A and 4B to suppress resonance.

In a series circuit of the leakage inductance Ls, the capacitor C, and the damping resistance Rdamp, the Q-value and the damping ratio ζ are represented by Equations (3) and (4) below.

$$Q=(1/R\text{damp})\times(Ls/C)^{1/2} \qquad (3)$$

$$\zeta=\tfrac{1}{2}Q=(R\text{damp}/2)\times(C/Ls)^{1/2} \qquad (4)$$

Here, the damping resistance Rdamp can be selected by obtaining a value such that the damping ratio ζ exceeds a predetermined value, for example.

Here, when it is assumed that the smoothing capacitor does not contribute to resonance and a bypass capacitor Cs-in that bypasses the photo-coupler of the driving circuit (the gate driver) is the only capacitor that forms the resonance circuit, the damping ratio ζ is represented by Equation (5) below.

$$\zeta=\tfrac{1}{2}Q=(R\text{damp}/2)\times(Cs\text{-}in/Ls)^{1/2} \qquad (5)$$

When is a predetermined value of the damping ratio ζ, the damping resistance Rdamp can be represented by Equation (6) below.

$$R\text{damp}>\zeta 2k\times(Ls/Cs\text{-}in)^{1/2} \qquad (6)$$

Hereinafter, a configuration example (first to sixth configuration examples) of the insulated power source and the power conversion device of the present invention will be described with reference to FIGS. 5 to 12. The first to third configuration examples illustrated in FIGS. 5 to 9 are embodiments of the bias power source and illustrate an example of a DCDC converter in which a step-down chopper circuit is used as a main circuit. The fourth configuration examples illustrated in FIGS. 10(a) and 10(b) are examples of a DCDC converter in which a step-up chopper circuit is used as a main circuit, the fifth configuration example illustrated in FIG. 11 is an example in which a DCDC converter is configured as an interleaved converter, and the sixth configuration example illustrated in FIG. 12 is a configuration example of a DCAC inverter.

First Configuration Example

Figure 5:
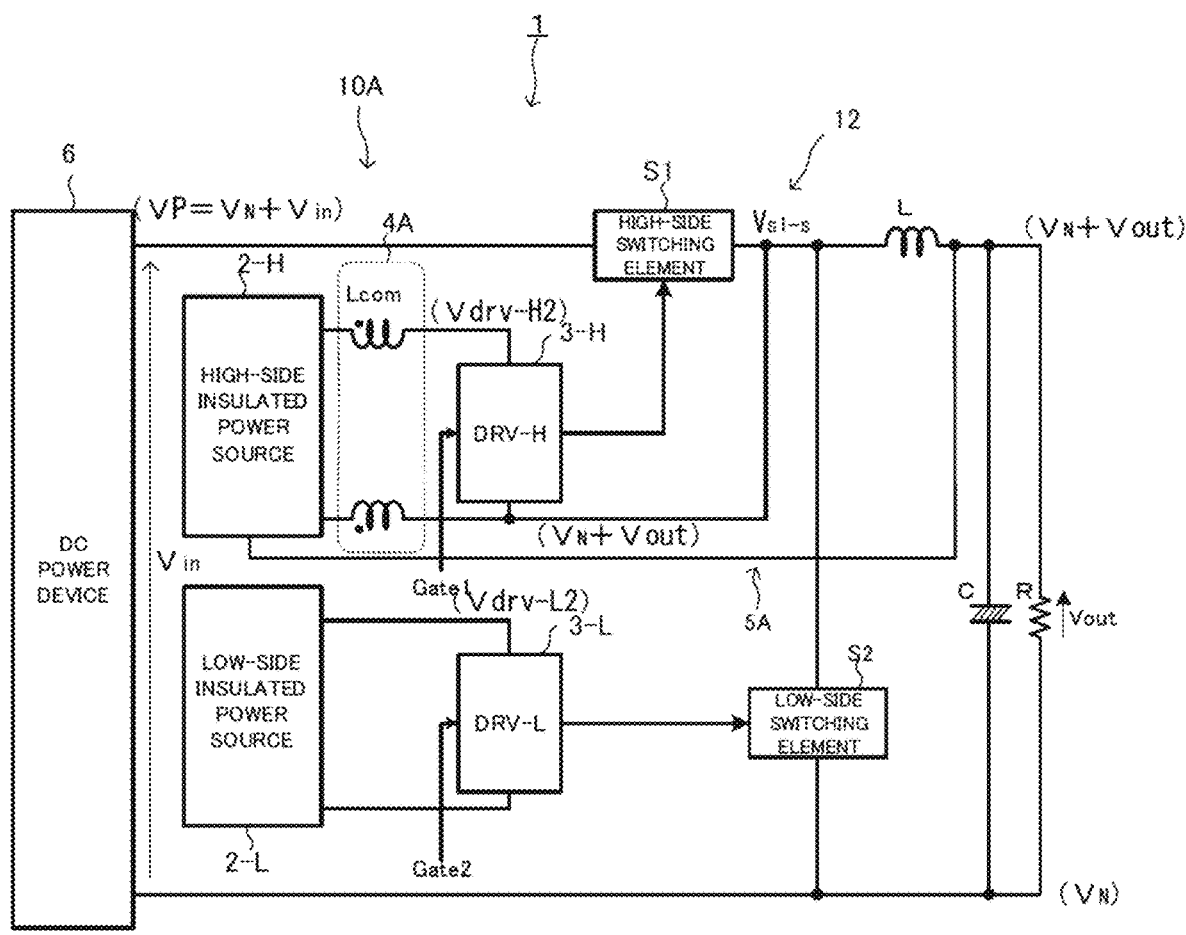
FIG. 5 is a schematic block diagram for describing a first configuration example of the present invention.

In the first configuration example, a bias power source 5A of a first embodiment applies a voltage to the high-side insulated power source. FIG. 5 illustrates a schematic block diagram, and FIG. 6 illustrates a configuration example.

A DCDC converter 10A of the first configuration example includes the bias power source 5A of the first embodiment as a bias power source having the configuration illustrated in FIGS. 1(a) to 1(d). The bias power source 5A has a configuration in which a high-voltage-side output terminal of the step-down chopper circuit 12 is connected to the low voltage side of the high-side insulated power source 2-H. With this configuration, the voltage (VN+Vout) of the high-voltage-side output terminal of the step-down chopper circuit 12 is applied to the low voltage side of the high-side insulated power source 2-H to set the reference potential of the high-side insulated power source 2-H.

The voltage (VN+Vout) of the high-voltage-side output terminal of the step-down chopper circuit 12 is a voltage in which the output voltage Vout applied to the load resistance R is superimposed on the voltage VN of the negative voltage terminal of the step-down chopper circuit 12.

Figure 6:
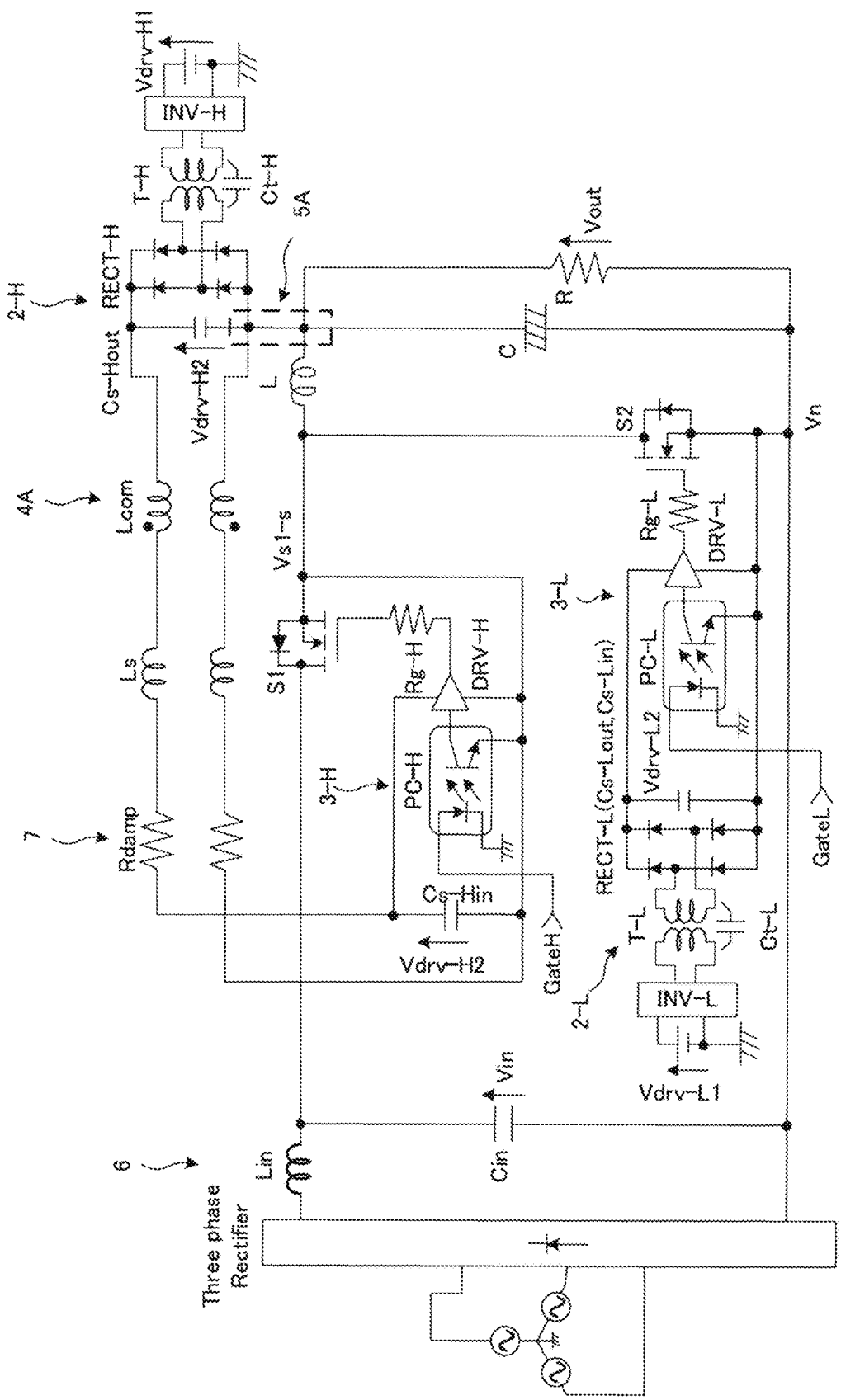
FIG. 6 is a circuit example for describing a DCDC converter in which a step-down chopper circuit according to the first configuration example of the present invention is used as a main circuit.

FIG. 6 illustrates a circuit configuration of the schematic block diagram illustrated in FIG. 5.

The DC power source 6 includes a three-phase power source having a grounded neutral point, a three-phase rectifier that converts a three-phase AC current to a DC current, and a smoothing circuit formed of a series-parallel circuit of a coil Lin and a capacitor Cin. The three-phase power source may use a 3-phase commercial power source of 50 Hz, for example. When the 3-phase commercial power source of 50 Hz is used, the frequency of the reference voltage VN obtained by the DC power source 6 is 150 Hz.

The high-side insulated power source 2-H is configured such that a high-side DC power source, a high-side inverter INV-H that converts the DC voltage Vdrv-H1 of the high-side DC power source from DC to AC, a high-side insulated transformer T-H that converts the AC output of the high-side inverter INV-H to a voltage, and a high-side rectifier RECT-H that converts the AC output of the high-side insulated transformer T-H to a DC current are connected in series and a smoothing capacitor Cs-Hout is connected in parallel thereto.

The high-side driving circuit 3-H includes a high-side gate driver DRV-H that controls an on/off operation of the high-side switching element S1, a high-side photo-switch PC-H that controls the driving of the high-side gate driver DRV-H, and a high-side bypass capacitor Cs-Hin that removes noise input to the high-side photo-switch PC-H, which are connected in series. The output of the high-side gate driver DRV-H is input to the gate of the high-side switching element S1 via a resistor Rg-H.

The low-side insulated power source 2-L is configured such that a low-side DC power source, a low-side inverter INV-L that converts a DC voltage Vdrv-L1 of the low-side DC power source from DC to AC, a low-side insulated transformer T-L that converts an AC output of the low-side inverter INV-L to a voltage, and a low-side rectifier RECT-L that converts the AC output of the low-side insulated transformer T-L to a DC current are connected in series and a smoothing capacitor Cs-Lout is connected in parallel thereto.

The low-side driving circuit 3-L includes a low-side gate driver DRV-L that controls an on/off operation of the low-side switching element S2, a low-side photo-switch PC-L that controls the driving of the low-side gate driver DRV-L, and a low-side bypass capacitor Cs-Lin that removes noise input to the low-side photo-switch PC-L, which are connected in series. The output of the low-side gate driver DRV-L is input to the gate of the low-side switching element S2 via the resistor Rg-L.

The common mode reactor 4A is provided in the wire between the high-side insulated power source 2-H and the high-side driving circuit 3-H. The common mode reactor 4A is formed of a coil Lcom connected to both the high-voltage-side wire and the low-voltage-side wire that connect the smoothing capacitor Cs-Hout of the high-side insulated power source 2-H and the high-side bypass capacitor Cs-Hin of the high-side driving circuit 3-H.

The inductance Ls in FIG. 6 indicates a leakage inductance of the common mode reactor 4A, and Rdamp is a damping resistance that suppresses resonance occurring due to the leakage inductance Ls.

Second Configuration Example

Figure 7:
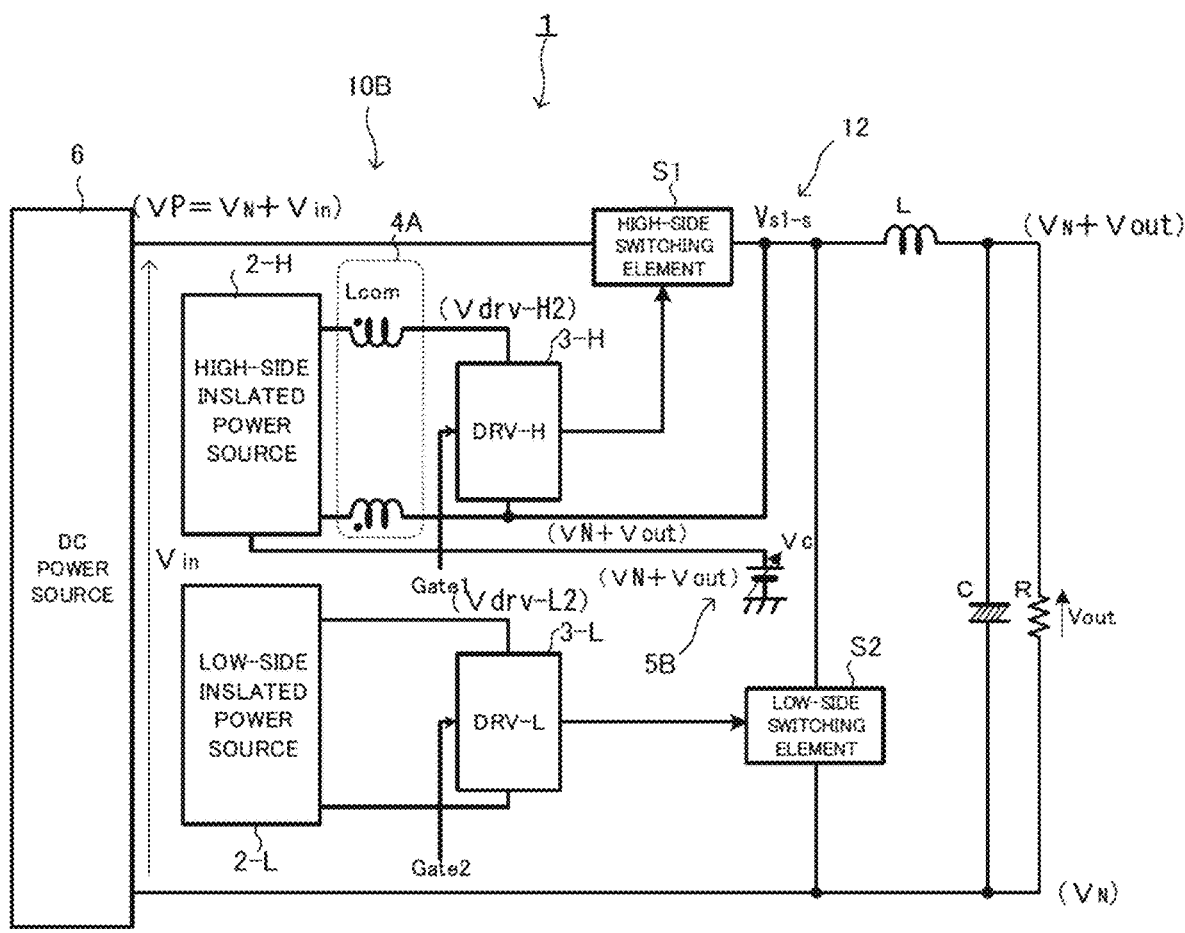
FIG. 7 is a schematic block diagram for describing a second configuration example of the present invention.

In the second configuration example, a bias power source of a second embodiment applies a voltage to the high-side insulated power source. FIG. 7 illustrates a schematic block diagram and FIG. 8 illustrates a configuration example.

A DCDC converter 10B of the second configuration example includes a bias power source 5B of a second embodiment as a bias power source having the configuration illustrated in FIGS. 1(a) to 1(d). The bias power source 5B is configured to apply a low voltage to the high-side insulated power source 2-H using a separate power source, and the separate voltage source Vc is set to the same voltage as a voltage (VN+Vout) which is an addition of the output voltage Vout and the voltage VN of the negative voltage terminal of the step-down chopper circuit. With this configuration, the same voltage as the voltage (VN+Vout) of the high-voltage-side output terminal of the step-down chopper circuit 12 is set as the low-voltage-side potential of the high-side insulated power source 2-H.

Figure 8:
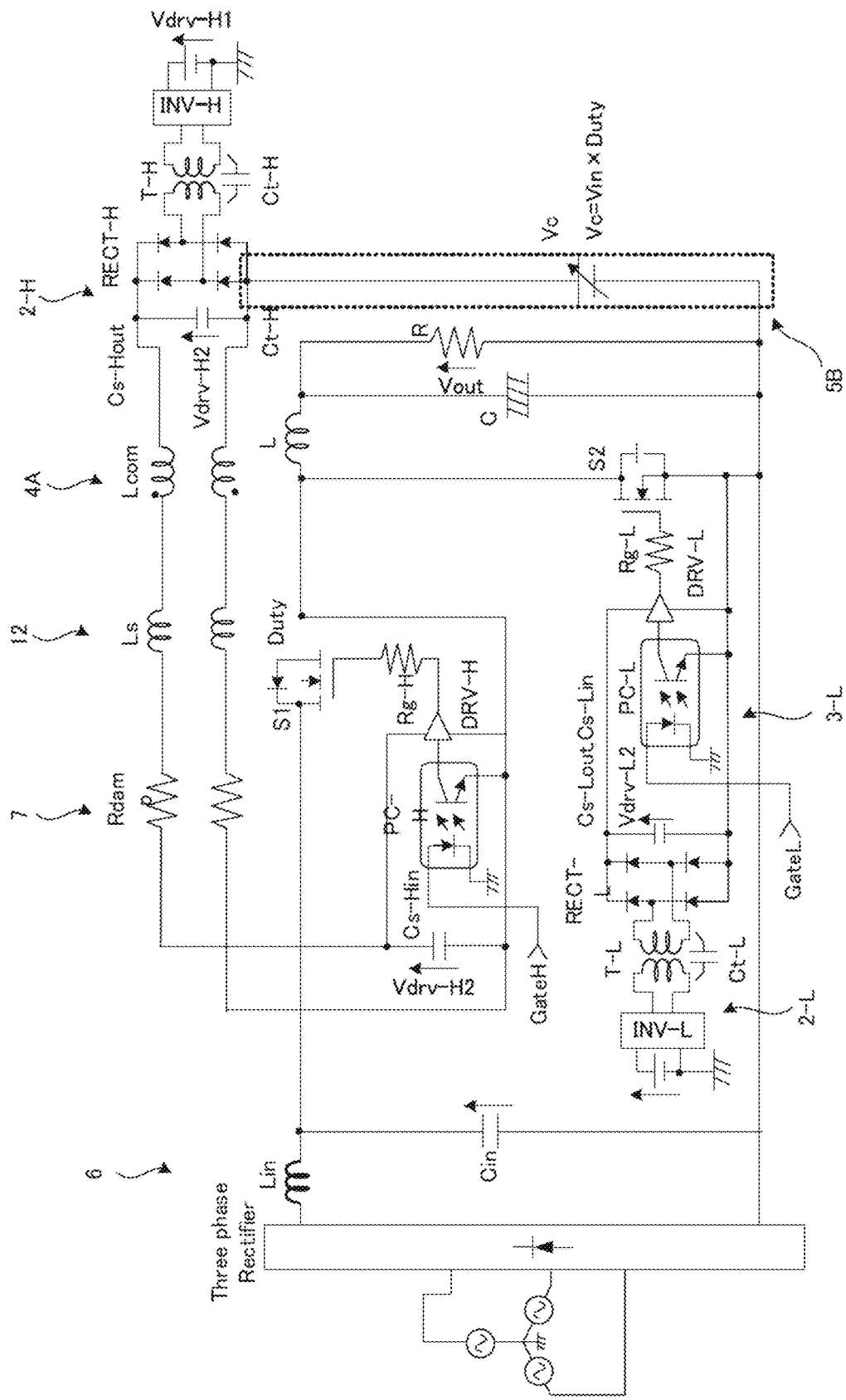
FIG. 8 is a circuit example for describing a DCDC converter in which a step-down chopper circuit according to the second configuration example of the present invention is used as a main circuit.

FIG. 8 illustrates a circuit configuration of the schematic block diagram illustrated in FIG. 7. The circuit element illustrated in FIG. 8 is the same as the circuit element illustrated in FIG. 6 except that the bias power source 5A is changed to a bias power source 5B. In the following description, the description of the portions common to those of the first configuration example illustrated in FIG. 6 will be omitted and the bias power source 5B only will be described.

The bias power source 5B is configured such that a voltage source Vc is connected to a low voltage side of the high-side insulated power source 2-H. The voltage source Vc is set to the same voltage as the output voltage Vout of the main circuit. Due to this, the voltage of (VN+Vout) is set to the low voltage side of the high-side insulated power source 2-H. When the input voltage of the step-down chopper circuit 12 which is the main circuit is Vin and the duty ratio of the high-side switching element S1 is Duty, the voltage of the voltage source Vc is set to (Vin×Duty). Therefore, the voltage of the voltage source Vc of the bias power source 5B can be set on the basis of a known input voltage Vin and Duty.

Third Configuration Example

In the third configuration example, a bias power source of a third embodiment applies a voltage to the high-side insulated power source. FIG. 9 illustrates a schematic block diagram.

A DCDC converter 10C of the third configuration example includes a bias power source 5C of the third embodiment as a bias power source having the configuration illustrated in FIGS. 1(a) to 1(d). The bias power source 5C is configured to set the low-voltage-side potential of the high-side insulated power source 2-H using a separate power source similarly to the bias power source 5B of the second embodiment, and the separate voltage source Vc generates the same voltage as the output voltage Vout on the basis of the gate signals Gate1 and Gate2. With this configuration, the voltage (VN+Vout) of the high-voltage-side output terminal of the step-down chopper circuit 12 is set as the low-voltage-side potential of the high-side insulated power source 2-H.

The bias power source 5C is configured such that the bias power source 5C is connected between the low voltage side of the main circuit of the step-down chopper circuit and the low voltage side of the high-side insulated power source 2-H. The bias power source 5C includes a bias power source circuit 5C1 and a control unit 5C2. The control unit 5C2 receives a gate signal Gate1 for controlling an on/off operation of the high-side driving circuit 3-H, a gate signal Gate2 for controlling an on/off operation of the low-side driving circuit 3-L, and an input voltage Vin, calculates the duty ratio Duty from the gate signals Gate1 and Gate2, and generates the same voltage as the output voltage Vout by calculating (Vin×Duty) on the basis of the obtained Duty and the input voltage Vin. In this way, the bias power source 5C can form the voltage source Vc that outputs the same voltage as the output voltage Vout of the main circuit, and the voltage of (VN+Vout) is set to the low-voltage-side potential of the high-side insulated power source 2-H.

According to the configuration of the bias power source 5C, a voltage synchronized with variations in the gate signals Gate1 and Gate2 and the input voltage Vin can be set to the high-side insulated power source 2-H.

Fourth Configuration Example

The fourth configuration example is an example in which a DCDC converter is formed using a step-up chopper circuit instead of the step-down chopper circuit as the main circuit of the power conversion device. FIG. 10(a) illustrates a schematic block diagram and FIG. 10(b) illustrates a voltage relation of respective portions.

A DCDC converter 10D of the fourth configuration example includes a step-up chopper circuit 13 as a main circuit of the power conversion device. The DCDC converter 10D converts the input voltage Vin from the DC power source 6 using the step-up chopper circuit 13 as the main circuit and outputs a stepped-up output voltage Vout. The step-up chopper circuit 13 includes a series-parallel circuit of the high-side switching element S1 and the low-side switching element S2 between the smoothing capacitor C and the inductance L that form the series-parallel circuit and supplies an output voltage Vout to the load resistance R.

In the fourth configuration example, since a high-side configuration including the high-side insulated power source 2-H, the high-side driving circuit 3-H, and the common mode reactor 4 and a low-side configuration including the low-side insulated power source 2-L and the low-side driving circuit 3-L are common to those of the first to third configuration examples including the step-down chopper circuit, the description of these configurations will be omitted.

A DCDC converter 10D of the fourth configuration example includes a bias power source 5D of the fourth embodiment. The bias power source 5D is configured such that the input terminal which is the low voltage side of the step-up chopper circuit 13 is connected to the low voltage side of the high-side insulated power source 2-H. With this configuration, the voltage (VN+Vin) of the low-voltage-side input terminal of the step-up chopper circuit 13 is set as the low-voltage-side potential of the high-side insulated power source 2-H.

FIG. 10(b) illustrates voltage states of a positive voltage VP (=VN+Vin) of the input terminal of the main circuit, an output voltage (VN+Vout) of the output terminal of the main circuit, and a voltage (Vdrv-H+VN+Vout) of a gate driver signal for driving the gate of the high-side switching element S1 in a state in which the voltage VN of the negative voltage terminal of the main circuit is used as a reference voltage.

Since the voltage of the gate driver signal needs to be higher than the input-side (source-side) voltage of the high-side switching element S1, the reference voltage of the high-side insulated power source 2-H is set to Vs1-s, and a voltage (Vdrv-H+VN+Vout) in which a voltage (Vdrv-H+Vs1-s) which is an addition of the voltage Vdrv-H and the reference voltage Vs1-s is a peak voltage is used as the gate driver signal Vgate-H. The amplitudes of the voltages illustrated in FIG. 10(b) are schematically depicted for the sake of description and are different from the actual voltage amplitudes.

Fifth Configuration Example

The fifth configuration example is an example in which a main circuit of the pixel circuit is configured as a multi-phase circuit by interleaving. In this example, an example in which a step-down chopper circuit is used as a main circuit and a DCDC converter is configured as a two-phase interleaved circuit is illustrated. FIG. 11 illustrates a circuit example of the fifth configuration example.

A DCDC converter 10E of the fifth configuration example forms a two-phase main circuit by interleaving the power conversion device.

In this multi-phase configuration, a number of common mode reactors the same as the number of phases of the interleaved configuration are provided on the high side of each phase. The high-side insulated power source 2-H and the low-side insulated power source 2-L can be configured as one insulated power source common to respective phases.

In the configuration example illustrated in FIG. 11, on the high side, one high-side insulated power source 2-H includes two common mode reactors 4A-A and 4A-B and two high-side driving circuits 3-HA and 3-HB, the common mode reactor 4A-A and the high-side driving circuit 3-HA form one phase, and the common mode reactor 4A-B and the high-side driving circuit 3-HB form the other phase.

On the other hand, on the low side, one low-side insulated power source 2-L includes two low-side driving circuits 3-LA and 3-LB, the low-side driving circuit 3-LA forms one phase, and the low-side driving circuit 3-LB forms the other phase.

In the power conversion device having the interleaved configuration, when the same values as the coil Lcom and the damping resistance Rdamp of the common mode reactor set in the single-phase power conversion device illustrated in the first configuration example are selected, a voltage Vdrv-H2-A applied to a high-side bypass capacitor Cs-Hin-A of the photo-coupler of the high-side driving circuit 3-HA is the same voltage as a voltage Vdrv-H2-B applied to a high-side bypass capacitor Cs-Hin-B of the photo-coupler of the high-side driving circuit 3-HB. This voltage is a gate voltage applied to the gates of the high-side switching elements S1-A and S1-B and has an influence on the ON resistance of the switching elements. However, according to this configuration, since the gate voltages applied to the gates of both switching elements are equal to each other, the current values of the respective phases flowing through the multi-phase interleaved main circuit can be made equal to each other and unbalance of current can be prevented.

Although an example of a two-phase interleaved configuration is illustrated as a multi-phase interleaved configuration, the number of interleaved phases is not limited to two phases and the present invention can be applied to a multi-phase interleaved configuration of three or more phases.

In a DCDC converter 10E of the fifth configuration example, although an example of a DCDC step-down chopper converter is illustrated as the main circuit, the present invention can be applied to a converter in which a DCDC step-up chopper converter is used as a main circuit.

In these multi-phase interleaved configurations, the high side and the low side of the converter can be configured as a multi-phase configuration for one common insulated power source. In this multi-phase configuration, a high-side multi-phase configuration includes a plurality of high-side switching elements connected in parallel. In these high-side switching elements, the same voltage is applied from one common high-side insulated power source via a common mode reactor. When the same voltage is applied to the respective high-side switching elements, it is possible to equalize the ON resistances of the respective high-side switching elements and make the outputs of the respective phases equal.

Sixth Configuration Example

The sixth configuration example is an example in which a power conversion device is configured as a DCAC inverter and a DC input voltage Vin is power-converted and an AC output voltage Vout is output to an output impedance RL. In a configuration example of a DCAC inverter 11 illustrated in FIG. 12, two high-side driving circuits 3-HA and 3-HB on the high side and two low-side driving circuits 3-LA and 3-LB on the low side form a bridge circuit. A voltage is supplied from one common high-side insulated power source 2-H to the two high-side driving circuits 3-HA and 3-HB. On the other hand, a voltage is supplied from one common low-side insulated power source 2-L to the two low-side driving circuits 3-LA and 3LB.

Moreover, on the high side, the common mode reactor 4A is connected between the high-side insulated power source 2-H and the high-side driving circuit 3-HA, and the common mode reactor 4B is connected between the high-side insulated power source 2-H and the high-side driving circuit 3-HB.

The bias power source Vc is connected between the low voltage side of the high-side insulated power source 2-H and the low voltage side of the main circuit, and the low-voltage-side voltage of the high-side insulated power source 2-H is set to (VN+Vc). On the other hand, the low voltage side of the low-side insulated power source 2-L and the low voltage side of the main circuit are connected, and the reference voltage of the low-side insulated power source 2-L is set to VN.

Here, the voltage of the bias power source Vc is set to (Vin/2). Since a voltage of ½ of the input voltage Vin in each cycle is applied to the high-side driving circuits 3-HA and 3-HB that form the bridge circuit, by setting the bias power source Vc to (Vin/2), it is possible to magnetically reset the common mode reactors 4A and 4B appropriately.

When the values of the inductances Lcom-A and Lcom-B of the common mode reactors 4A and 4B are set to a value sufficiently larger than the output impedance RL of the DCAC inverter 11, the impedance of the high-side insulated power source 2-H when seen from the DCAC inverter 11 in a high frequency band can be set sufficiently larger than the output impedance of the DCAC inverter 11. In this way, it is possible to reduce the influence of the high-side insulated power source 2-H on the output impedance when seen from the DCAC inverter 11. This effect results from a configuration in which the core of the common mode reactor is separated to be independent from the core of the main circuit so that the inductance of the common mode reactor can be set arbitrarily.

In the embodiment of the DCAC inverter illustrated in the sixth configuration example, the bridge circuit includes a plurality of switching elements S1-A, S1-B, S2-A, and S2-B connected in parallel to one common insulated power source in each of the high side and the low side. The same voltage is supplied from one common high-side insulated power source 2-H to the plurality of high-side switching elements S1-A and S1-B via the common mode reactors 4A and 4B. By applying the same voltage to the respective high-side switching elements S1-A and S1-B, it is possible to equalize the ON resistances of the high-side switching elements S1-A and S1-B and suppress a variation in the output voltage of the DCAC inverter.

The technologies of the embodiments and the modifications are examples of the power source device according to the present invention, and the present invention is not limited to the embodiments. Various modifications can occur on the basis of the spirit of the present invention, and these modifications also fall within the scope of the present invention.

INDUSTRIAL APPLICABILITY

The power conversion device of the present invention can be applied to supplying high-frequency electric power to devices which uses high-frequency signals such as apparatuses for manufacturing semiconductors and liquid crystal panels, a vacuum deposition apparatus, and a heating and melting apparatuses.

REFERENCE SIGNS LIST

1 Power conversion device
2-H High-side insulated power source
2-L Low-side insulated power source
3-H, 3-HA, 3-HB High-side driving circuit
3-L, 3-LA, 3-LB Low-side driving circuit
4, 4A, 4B, 4C, 4A-A, 4A-B Common mode reactor
4a, 4b, 4c Winding
4d Resistor
4f, 4h Capacitor
5, 5A, 5B, 5C, 5D Bias power source
5C1 Bias power source circuit
5C2 Control unit
6 DC power source
7 Damping resistance
10, 10A, 10B, 10C, 10D, 10E DCDC converter
11 DCAC inverter
12 Step-down chopper circuit
13 Step-up chopper circuit
100 DC power source
110 DCDC converter power source
120H High-side insulated power source
120L Low-side insulated power source
130H, 130L Gate driver
C Smoothing capacitor
Cin Capacitor
Cs-in Bypass capacitor
Cs-Hin, Cs-Hin-A, Cs-Hin-B High-side bypass capacitor
Cs-Hout, Cs-Lout Smoothing capacitor
Cs-Lin Low-side bypass capacitor
Ct-H, Ct-L Parasitic capacitor
DRV-H High-side gate driver
DRV-L Low-side gate driver
GateH, GateL, Gate1, Gate2 Gate signal
INV-H High-side inverter
INV-L Low-side inverter
L, Lcom-A, Lcom-B, Ls Inductance
Lcom, Lin Coil
PC Photo-switch
PC-H High-side photo-switch
PC-L Low-side photo-switch
R Load resistance
RG-H Driving resistor
RG-L Driving resistor
Rdamp Damping resistance
Rg-H, Rg-L Resistor
RECT-H High-side rectifier
RECT-L Low-side rectifier
RL Output impedance
S1, S1-A, S1-B High-side switching element
S2 Low-side switching element
T-H High-side insulated transformer
T-L Low-side insulated transformer
Vdrv-H1, Vdrv-L1 DC voltage
Vdrv-H2, Vdrv-L2 DC voltage (Driving voltage)
Vgate-H Gate driver signal
VN Reference voltage
VP Reference voltage
Vc Voltage source, Bias power source
Vin Input voltage
Vout Output voltage
Vs1-s Displacement voltage

What is claimed is:

1. An insulated power source comprising:
a high-side insulated power source that supplies a driving voltage to a high-side driving circuit that controls a switching operation of a high-side switching element via an insulated transformer;
a low-side insulated power source that supplies a driving voltage to a low-side driving circuit via an insulated transformer that controls a switching operation of a low-side switching element; and
a bias power source connected to a low voltage side of the high-side insulated power source, wherein
the high-side insulated power source includes a common mode reactor between the high-side driving circuit and the high-side insulated power source, wherein
the high-side insulated power source includes a high-side DC power source, a high-side inverter that converts a DC voltage of the high-side DC power source from DC to AC, a high-side insulated transformer that converts an AC output of the high-side inverter to a voltage, and a high-side rectifier that converts an AC output of the high-side insulated transformer to a DC output, which are connected in series,
the high-side driving circuit includes a high-side gate driver that controls an on/off operation of the high-side switching element, a high-side photo-switch that controls the driving of the high-side gate driver, and a high-side bypass capacitor that removes noise input to the high-side photo-switch, which are connected in series,
the low-side insulated power source includes a low-side DC power source, a low-side inverter that converts a DC voltage of the low-side DC power source to an AC voltage, a low-side insulated transformer that converts an AC output of the low-side inverter to a voltage, and a low-side rectifier that converts an AC output of the low-side insulated transformer to a DC output, which are connected in series,
the low-side driving circuit includes a low-side gate driver that controls an on/off operation of the low-side switching element, a low-side photo-switch that controls the driving of the low-side gate driver, and a low-side bypass capacitor that removes noise input to the low-side photo-switch, which are connected in series, and the common mode reactor is provided in both a high-voltage-side wire and a low-voltage-side wire that connect the high-side insulated power source and a high-side bypass capacitor of the high-side driving circuit.

2. The insulated power source according to claim 1, wherein
the common mode reactor is configured such that a high-voltage-side wire and a low-voltage-side wire of the high-side insulated power source are wound around a common core in the same direction.

3. The insulated power source according to claim 2, further comprising:
a damping resistance connected in series to the common mode reactor.

4. The insulated power source according to claim 2, wherein
a common core of the common mode reactor is separated to be independent from a core of a coil included in a circuit of which the driving is controlled by the high-side driving circuit and the low-side driving circuit.

5. The insulated power source according to claim 1, wherein
a bias voltage of the bias power source is an output voltage of an output circuit that is driven by the high-side driving circuit.

6. A power conversion device that forms a DCDC converter, comprising:
a step-down chopper circuit in which a series-parallel connection circuit of a high-side switching element and a low-side switching element and an inductance are connected in series to a DC power source; and
the insulated power source according to claim 1, wherein the insulated power source is a power source that drives a high-side driving circuit and a low-side driving circuit that drive the high-side switching element and the low-side switching element, respectively.

7. The power conversion device according to claim 6, wherein
a bias voltage of the bias power source is an output voltage of the step-down chopper circuit.

8. A power conversion device that forms a DCDC converter, comprising:
a step-up chopper circuit in which an inductance and a series-parallel connection circuit of a high-side switching element and a low-side switching element are connected in series to a DC power source; and
the insulated power source according to claim 1, wherein the insulated power source is a power source that drives a high-side driving circuit and a low-side driving circuit that drive the high-side switching element and the low-side switching element, respectively.

9. The power conversion device according to claim 8, wherein
a bias voltage of the bias power source is an input voltage of the step-up chopper circuit.

10. The power conversion device according to claim 6, a high side and a low side each include a multi-phase interleaved configuration for one common insulated power source, and
a high-side multi-phase configuration includes a plurality of high-side switching elements connected in parallel, and voltages applied to the plurality of high-side switching elements are the same voltage supplied from the one common high-side insulated power source via the common mode reactor.

11. A power conversion device that forms a DCAC inverter and is formed of a bridge circuit of a high-side switching element and a low-side switching element with respect to a DC power source, comprising:
the insulated power source according to claim 1, wherein the high-side driving circuit and the low-side driving circuit of the insulated power source drive the high-side switching element and the low-side switching element, respectively.

12. The power conversion device according to claim 11, wherein
the insulated power source includes a bias power source connected to a low voltage side of the high-side insulated power source, and a bias voltage of the bias power source is ½ of an input voltage of the DCAC inverter.

13. The power conversion device according to claim 11, wherein
the bridge circuit includes a plurality of switching elements connected in parallel to one insulated power source common to the high side and the low side, and voltages applied to the plurality of high-side switching elements are the same voltage supplied from the one common high-side insulated power source via the common mode reactor.

* * * * *